(12) United States Patent
Lee et al.

(10) Patent No.: US 11,682,577 B2
(45) Date of Patent: Jun. 20, 2023

(54) SPIN HEAD, APPARATUS AND METHOD FOR TREATING A SUBSTRATE INCLUDING THE SPIN HEAD

(71) Applicant: SEMES CO., LTD., Chungcheongnam-do (KR)

(72) Inventors: Jihwan Lee, Gyeonggi-do (KR); Jungbong Choi, Gyeonggi-do (KR); Chan Young Heo, Chungcheongnam-do (KR); Pil Kyun Heo, Gyeongsangbuk-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 840 days.

(21) Appl. No.: 16/733,688

(22) Filed: Jan. 3, 2020

(65) Prior Publication Data

US 2020/0144096 A1    May 7, 2020

Related U.S. Application Data

(62) Division of application No. 15/351,770, filed on Nov. 15, 2016, now abandoned.

(30) Foreign Application Priority Data

Nov. 17, 2015 (KR) .......................... 10-2015-0161256
Feb. 25, 2016 (KR) .......................... 10-2016-0022255

(51) Int. Cl.
*H01L 21/687* (2006.01)
*H01L 21/67* (2006.01)
*B08B 3/04* (2006.01)

(52) U.S. Cl.
CPC ............ *H01L 21/6875* (2013.01); *B08B 3/04* (2013.01); *H01L 21/6704* (2013.01);
(Continued)

(58) Field of Classification Search
CPC ......... H01L 21/67051; H01L 21/68728; H01L 21/6875; H01L 21/68735; H01L 21/6708;
(Continued)

(56) References Cited

U.S. PATENT DOCUMENTS

| 5,192,087 A | 3/1993 | Kawashima et al. |
| 5,431,421 A | 7/1995 | Thompson et al. |

(Continued)

FOREIGN PATENT DOCUMENTS

| CN | 1815707 A | 8/2006 |
| CN | 103377971 A | 10/2013 |

(Continued)

OTHER PUBLICATIONS

Chinese Office Action for application No. 201611011607.5 dated Sep. 4, 2019 wth English translation.

*Primary Examiner* — Lee D Wilson
(74) *Attorney, Agent, or Firm* — Carter, DeLuca & Farrell LLP

(57) ABSTRACT

The present disclosure relates to a spin head, apparatus and method for treating a substrate including the spin head. The spin head includes a supporting plate where a substrate is placed and a chuck pin placed on the supporting plate and supporting a lateral portion of the substrate, wherein the chuck pin includes an outer body and an inner body inserted in the outer body and provided with a different material from the outer body, wherein each outer body and the inner body is provided with any one of a first material or a second material, and wherein one material of the first material and the second material is provided with a material having lower heat conductivity and better thermal resistance than another one.

21 Claims, 23 Drawing Sheets

(52) U.S. Cl.
CPC .. *H01L 21/67051* (2013.01); *H01L 21/68728* (2013.01); *H01L 21/68757* (2013.01)

(58) Field of Classification Search
CPC ........... H01L 21/6715; H01L 21/68764; H01L 21/02041; H01L 21/67023; H01L 21/6704; H01L 21/68721; H01L 21/68757; B08B 3/04
See application file for complete search history.

(56) References Cited

U.S. PATENT DOCUMENTS

| | | | |
|---|---|---|---|
| 6,964,419 | B2 | 11/2005 | Jan |
| 8,394,234 | B2 | 3/2013 | Lee |
| 2002/0006876 | A1 | 1/2002 | Hongo et al. |
| 2003/0070755 | A1 | 4/2003 | Emami |
| 2004/0065358 | A1 | 4/2004 | Teutsch et al. |
| 2004/0178553 | A1 | 9/2004 | Camm et al. |
| 2007/0199656 | A1 | 8/2007 | Leavitt et al. |
| 2008/0061519 | A1 | 3/2008 | Cho et al. |
| 2009/0093123 | A1 | 4/2009 | Lee et al. |
| 2011/0146728 | A1 | 6/2011 | Brugger et al. |
| 2011/0148022 | A1 | 6/2011 | Brugger et al. |
| 2013/0092195 | A1* | 4/2013 | Takimoto .......... H01L 21/67276 134/26 |
| 2013/0219693 | A1 | 8/2013 | Wu et al. |
| 2015/0059808 | A1 | 3/2015 | Yu et al. |
| 2015/0311108 | A1 | 10/2015 | Horiuchi |
| 2020/0144096 | A1* | 5/2020 | Lee ................... H01L 21/68757 |

FOREIGN PATENT DOCUMENTS

| | | | | |
|---|---|---|---|---|
| JP | H1140656 | A | | 2/1999 |
| JP | 2000100706 | A | | 4/2000 |
| JP | 2005019701 | A | * | 1/2005 ........... H01L 21/304 |
| JP | 2005019701 | A | | 1/2005 |
| JP | 5292799 | B2 | | 9/2013 |
| JP | 2014241390 | A | | 12/2014 |
| JP | 5916619 | B2 | | 5/2016 |
| KR | 100593595 | B1 | | 6/2006 |
| KR | 10-2009-0058783 | A | | 6/2009 |
| KR | 100941078 | B1 | * | 2/2010 ....... H01L 21/67051 |
| KR | 100941078 | B1 | | 2/2010 |
| KR | 101317328 | B1 | | 10/2013 |

* cited by examiner

SPIN HEAD, APPARATUS AND METHOD FOR TREATING A SUBSTRATE INCLUDING THE SPIN HEAD

CROSS-REFERENCE TO RELATED APPLICATIONS

This application is a divisional of U.S. patent application Ser. No. 15/351,770, filed Nov. 15, 2016, which claims the benefit of and priority to Korean Patent Application No. 10-2015-0161256, filed on Nov. 17, 2015, and Korean Patent Application No. 10-2016-0022255, filed on Feb. 25, 2016, the entire contents of each of which are hereby incorporated by reference.

BACKGROUND OF THE INVENTION

The present invention disclosed herein relates to a spin head supporting a substrate, apparatus and method for treating a substrate including the spin head.

As a semiconductor device becomes having high density, high integrity, and high performance, miniaturization of a circuit pattern rapidly happens and thereby, containments like a particle, an organic containment, a metal containment, and etc. residing in a substrate surface highly influences a production rate and the device's characteristics. Therefore, a cleaning process for removing different kinds of containments stacked to the substrate surface is issued as an important process during semiconductor manufacturing, and a treating process for cleaning the substrate has been performed before and after each unit process of semiconductor manufacturing.

Meanwhile, during a process for treating a substrate by supplying a treatment liquid to the substrate, the process is performed with a lateral portion or a bottom of the substrate being supported by a chuck pin or a supporting pin, respectively. Depending on a process, a treatment liquid may be supplied with various temperatures such as a treatment liquid with high temperature or a treatment liquid with low temperature.

FIG. 1 shows a temperature distribution of each area of the substrate during treating a substrate by supplying a treatment liquid to the substrate. Referring to FIG. 1, areas a1-a5, where a chuck pin and a supporting pin are contacted with the substrate, have different temperature than another area of the substrate during treating the substrate by supplying the treatment liquid to the substrate. According to this, areas a1-a5, where the chuck pin and the supporting pin are contacted with the substrate, have a problem that a cleaning efficiency is lower than other area of the substrate.

SUMMARY OF THE INVENTION

The present invention provides a spin head having a chuck pin or a supporting pin with optimized heat conductivity depending on kinds of a chemical and a temperature, apparatus and method for treating a substrate including the spin head.

Also, the present invention provides a spin head, an apparatus including the spin head for treating a substrate and a method for treating a substrate which may enhance efficiency of a process for treating the substrate by supplying a treatment liquid.

Also, the present invention provides an apparatus for treating a substrate and a method for treating a substrate which can evenly treat an area of the substrate contacted to a chuck pin and a supporting pin and the other area of the substrate.

The objects of the inventive concept are not limited to the above mentioned effects. Other objects thereof will be understandable by those skilled in the art from the following descriptions and the present application.

The present invention provides a spin head for supporting a substrate.

According to an embodiment of the present invention, the spin head may comprise a supporting plate on which a substrate is placed; and a chuck pin provided in the supporting plate for supporting a lateral portion of the substrate; wherein the chuck pin comprises an outer body and an inner body inserted into the outer body, the inner body is provided with a material different from the outer body, the outer body and the inner body are provided with any one of a first material or a second material, respectively, and one of the first material and the second material has a lower heat conductivity and a better thermal resistance than the other of the first material and the second material.

According to an embodiment, the first material comprises a ceramic material and the second material is provided with a resin material.

According to an embodiment, the ceramic material comprises a silicon carbide and the resin material is provided with a perfluoralkoxy (PFA).

According to an embodiment, wherein a groove is formed in a lateral portion of the outer body and an end of the substrate is contacted with the groove, and the inner body is provided with a rod shape.

According to an embodiment, wherein the outer body is provided to surround a lateral portion and a top of the inner body.

According to an embodiment, wherein the outer body is provided to surround a lateral portion of the inner body and a top of the inner body is higher in level than a top of the outer body.

According to an embodiment, a bottom of the inner body is positioned inner side of the outer body.

According to an embodiment, the bottom of the inner body is provided to protrude to outside of the outer body.

According to an embodiment, the spin head further comprises a chuck rod coupled with the chuck pin and positioned inner side of the supporting plate and a chuck pin driver for driving the chuck rod, and wherein the chuck rod is provided with a metal material.

According to an embodiment, the outer body is provided with the first material and the inner body is provided with the second material.

According to an embodiment, the outer body is provided with the second material and the inner body is provided with the first material.

According to other embodiments of the present invention, the spin head may comprise a supporting plate on which a substrate is placed; and a supporting pin provided in the supporting plate for supporting a bottom of the substrate, wherein the supporting pin comprises a first body and a second body provided with a different material from the first body, the first body and the second body is provided with any one of a first material or a second material, respectively, and one of the first material and the second material is provided with a material having lower heat conductivity and a better thermal resistance than the other of the first material and the second material.

According to an embodiment, the first material comprises a ceramic material and the second material is provided with a resin material.

According to an embodiment, the ceramic material comprises a silicon carbide and the resin material is provided with a perfluoralkoxy (PFA).

According to an embodiment, a top of the first body is contacted with a bottom of the substrate and the second body is coupled to a bottom of the first body.

According to an embodiment, the first body is provided to surround a lateral portion and a top of the second body and the second is provided with a load shape.

According to an embodiment, the first is provided with the first material and the second body is provided with the second material.

According to an embodiment, the first body is provided with the second material and the second body is provided with the first material.

The present invention provides an apparatus for treating a substrate.

According to an embodiment of the present invention, the apparatus for treating a substrate may comprise a first chamber for treating the substrate by supplying a first treatment liquid; and a second chamber for treating the substrate by supplying a second treatment liquid; wherein the first chamber comprises a first spin head comprising a first chuck pin for supporting the substrate at a lateral portion of the substrate and a first ejection unit for supplying the first treatment liquid to the substrate placed on the first spin head, wherein the second chamber comprises a second spin head comprising a second chuck pin for supporting the substrate from a lateral portion of the substrate and a second ejection unit for supplying the second treatment liquid to the substrate placed on the second spin head, wherein the first chuck pin comprises a first outer body and a first inner body provided with a different material from each other, wherein the second chuck pin comprises a second outer body and a second inner body provided with a different material from each other, and wherein a correlation between the first outer body and the first inner body is provided differently from a correlation between the second outer body and the second inner body.

According to an embodiment, the correlation may comprise a ratio of a cross sectional area between the outer body and the inner body.

According to an embodiment, the correlation may comprise a ratio of a length between the outer body and the inner body.

According to an embodiment, the correlation may comprise whether or not the inner body protrudes outside of the outer body.

According to an embodiment, the correlation may comprise what material the outer body and the inner body are provided with.

According to an embodiment, the correlation comprises what material the outer body and the inner body are provided with, wherein both of the first outer body and the second inner body are provided with one of the first material and the second material, and both of the second outer body and the first inner body are provided with the other of the first material and the second material, and wherein one of the first material and the second material is provided with a material having lower heat conductivity and a better thermal resistance than the other of the first material and the second material.

According to an embodiment, the first material comprises a ceramic material and the second material is provided with a resin material.

According to an embodiment, wherein the ceramic material comprises a silicon carbide and the resin material is provided with a perfluoralkoxy (PFA).

According to an embodiment, the first outer body has a first groove at a lateral portion thereof and an end of the substrate is contacted with the first groove, wherein the first inner body is provided with a load shape, the second outer body has a second groove at a lateral portion thereof and an end of the substrate is contacted with the second groove, wherein the second inner body is provided with a load shape.

According to an embodiment, the first outer body is provided to surround a lateral portion and top of the first inner body and the second outer body is provided to surround a lateral portion and top of the second inner body.

According to an embodiment, the first outer body is provided to surround a lateral portion of the first inner body, wherein a top of the first inner body is higher in level than a top of the first outer body, wherein the second outer body is provided to surround a lateral portion of the second inner body, and wherein a top of the second inner body is higher in level than a top of the second outer body.

According to an embodiment, the first outer body and the second inner body are provided with the first material and wherein the second outer body and the first inner body are provided with the second material.

According to an embodiment, the first outer body and the second inner body are provided with the second material and wherein the second outer body and the first inner body are provided with the first material.

According to an embodiment, the first spin head may further comprise a first supporting pin supporting the substrate at the bottom, wherein the second spin head may further comprise a second supporting pin supporting the substrate at the bottom, wherein the second supporting pin may comprise first body and a second body provided with different material with the first body, wherein the each first body and the second body may be provided with any one of the first material or the second material, and wherein the one of the first material and the second material may be provided with a material having lower heat conductivity and better thermal resistance than another one.

According to an embodiment, the first material comprises a ceramic material and the second material is provided with a resin material.

According to an embodiment, The apparatus for treating a substrate of claim 33, wherein the ceramic material comprises a silicon carbide and the resin material is provided with a perfluoralkoxy (PFA).

According to an embodiment, a top of the first body is contacted with a bottom of the substrate and the second body is coupled to a bottom of the first body.

According to an embodiment, the first body is provided to surround a lateral portion and top of the second body and wherein the second body is provided with a load shape.

According to an embodiment, the first body is provided with the first material and the second body is provided with the second material.

According to an embodiment, the first body is provided with the second material and the second body is provided with the first material.

According to an embodiment, the apparatus for treating a substrate may comprise a first apparatus for treating a substrate and a second apparatus for treating a substrate, wherein the first apparatus for treating a substrate comprises a first index module and a first process treating module, the first index module comprising a first load port on which a container containing the substrate is placed and a first index robot for transferring the substrate to the first load port, and the first process treating module comprising a plurality of a first process chambers for treating the substrate and a first transfer unit for transferring the substrate to the first process chambers, wherein the second apparatus for treating a substrate comprises a second index module and a second process treating module, the second index module comprising a second load port on which a container containing the substrate is placed and a second index robot for transferring the substrate to the second load port, and the second process treating module comprising a plurality of a second process chambers for treating the substrate and a second transfer unit for transferring the substrate to the second process chambers, wherein the first process chamber comprises the first chamber, and wherein the second process chamber comprises the second chamber.

According to an embodiment, the apparatus for treating a substrate may comprise a first apparatus for treating a substrate and a second apparatus for treating a substrate, wherein the first apparatus for treating a substrate comprises a first index module and a first process treating module, the first index module comprising a first load port on which a container containing the substrate is placed and a first index robot for transferring the substrate to the first load port, and the first process treating module comprising a plurality of a first process chambers for treating the substrate and a first transfer unit for transferring the substrate to the first process chambers, wherein the second apparatus for treating a substrate comprises a second index module and a second process treating module, the second index module comprising a second load port on which a container containing the substrate is placed and a second index robot for transferring the substrate to the second load port, and the second process treating module comprising a plurality of a second process chambers for treating the substrate and a second transfer unit for transferring the substrate to the second process chambers, wherein the first process chamber comprises the first chamber and the second chamber.

According to an embodiment, a temperature of the first treatment liquid is higher than a temperature of the second treatment liquid.

According to an embodiment, the first apparatus for treating a substrate may further comprise a heating unit heating the substrate and positioned in the first spin head.

According to an embodiment, the apparatus for treating a substrate may further comprise a controller for controlling the first transfer unit and the second transfer unit, wherein the controller controls the first transfer unit so that the substrate is supported by the first chuck pin when treating the substrate with the first treatment liquid and the controller controls the second transfer unit so that the substrate is supported by the second chuck pin when treating the substrate with the second treatment liquid.

The present invention provides a method for treating a substrate.

According to an embodiment of the present invention, the method for treating the substrate may comprise treating the substrate which is supported by the first chuck pin by supplying the first treatment liquid and treating the substrate which is supported by the second chuck pin by supplying the second treatment liquid.

According to an embodiment, the first treatment liquid is provided with higher temperature than the second treatment liquid.

According to an embodiment, the first treatment liquid comprises an acid and wherein the second treatment liquid comprises a sulfuric acid.

According to an embodiment, the second spin head may further comprise a second supporting pin for supporting the substrate at the bottom of the substrate, wherein the second supporting pin comprises a first body of a first material and a second body of a second material, and wherein one of the first material and the second material is provided with a material having a lower heat conductivity and a better thermal resistance than the other of the first material and the second material.

According to an embodiment of the present invention, an efficiency of the substrate treating process may be enhanced by providing the chuck pin or the supporting pin having optimized heat conductivity depending on a kinds of chemical or temperatures.

Also, according to an embodiment of the present invention, an efficiency of the substrate treating process may be enhanced by providing an optimized heat conductivity using various variables such as material, dimension (length), cross sectional area ratio of the chuck pin or the supporting pin.

Also, according to an embodiment of the present invention, an entire area of the substrate may be treated equally by providing the chuck pin or the supporting pin having optimized heat conductivity depending on a kinds of chemical or temperatures.

The objects of the inventive concept are not limited to the above mentioned effects. Other objects thereof will be understandable by those skilled in the art from the following descriptions.

DETAILED DESCRIPTION

Various example embodiments will be described more fully hereinafter with reference to the accompanying drawings, in which some example embodiments are shown. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Therefore, features of the drawings are exaggerated to emphasize definite explanation.

Figure 2:
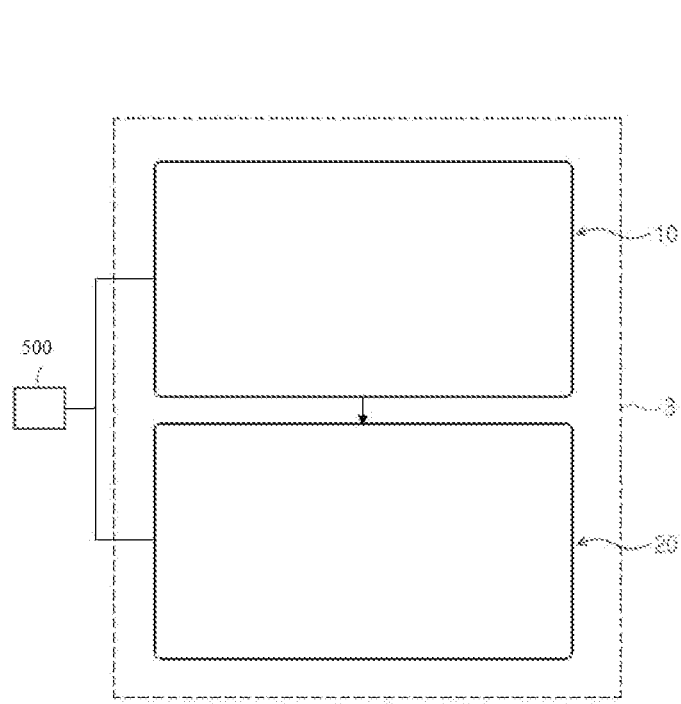
FIG. 2 is a plan view of an apparatus for treating a substrate in accordance with an embodiment of the present invention.

FIG. 2 is a plan view of an apparatus for treating a substrate in accordance with an embodiment of the present invention. An apparatus for treating a substrate 1 is provided to one semiconductor line 3.

The apparatus 1 for treating a substrate 1 performs a treatment process to the substrate by providing a treatment liquid. The apparatus for treating a substrate 1 comprises a first apparatus 10 for treating a substrate and a second apparatus 20 for treating a substrate.

Figure 3:
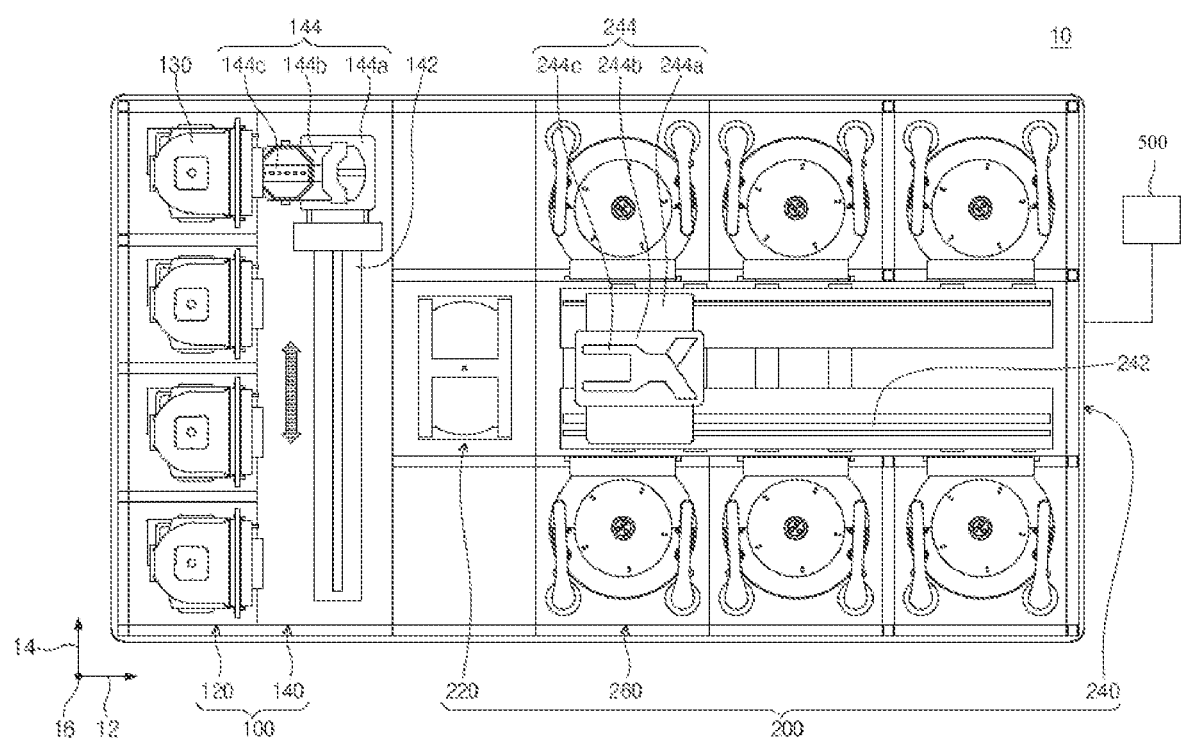
FIG. 3 is a plan view of an example of a first apparatus for treating a substrate of FIG. 2.

FIG. 3 is a plan view of an example of the first apparatus for treating a substrate of FIG. 2. Hereinafter, referring to FIG. 2, the first apparatus 10 for treating a substrate comprises a first index module 100 and a first process treating module 200. The index module 100 includes a first load port 120 and a first transfer frame 140. The first load port 120, the first transfer frame 140, and the first process treating module 200 are sequentially arranged in a line. Hereinafter, a direction where the first load port 120, the first transfer frame 140, and the first process treating module 200 are arranged is referred to as a first direction 12. And a direction perpendicular to the first direction 12 is referred to as a second direction 14, when view from a top side, and a direction perpendicular to a plane including the first direction 12 and the second direction 14 is referred to as a third direction 16.

Figure 1:
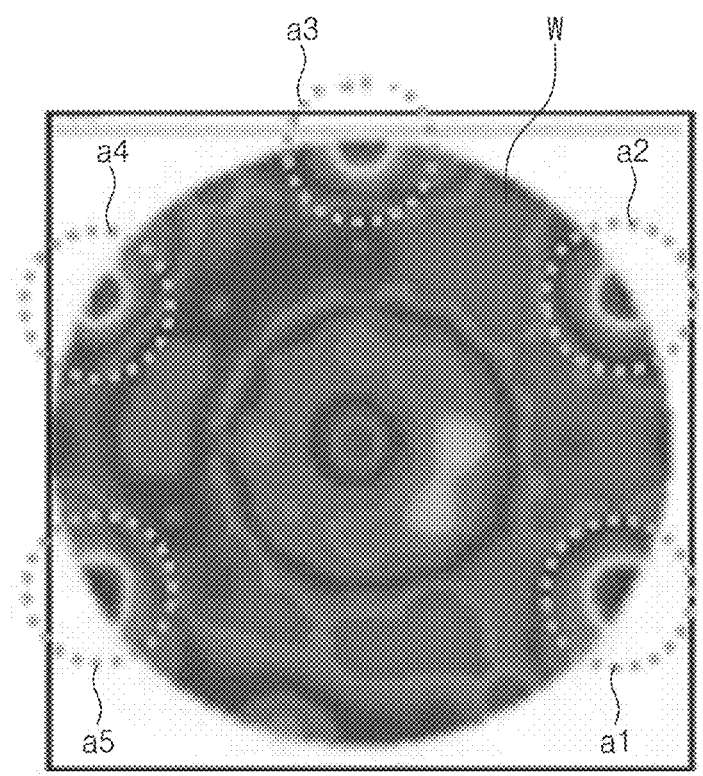
FIG. 1 shows a temperature distribution of each area of a substrate during treating a substrate by supplying a treatment liquid to the substrate.

A first carrier 130 where a substrate W is stored is seated on the first load port 120. The first load port 120 is provided with a plurality of numbers and they are arranged in a line along the second direction 14. In the FIG. 1, as an example, four first load ports 120 are provided. However, the number of load ports 120 may be increased or decreased depending on a requirement like process efficiency and a foot print of the first process treating module 200. In the carrier 130, a plurality of slots (not described) are provided to support an edge of the substrate W. A plurality of slots are provided along the third direction 16 and a plurality of substrates W are placed inside the carrier vertically stacked to each other along the third direction 16. As the carrier 130, a front opening unified pod (FOUP) may be used.

The first process treating module 200 comprises a first buffer unit 220, a first transfer unit 240, and a first process chamber 260. The first transfer unit 240 is provided such that the lengthwise direction thereof is parallel with the first direction 12. The first process chambers 260 are provided in one side and the other side of the first transfer unit 240 along the second direction 14, respectively. The first process chamber 260 placed in one and the other sides of the first transfer unit 240 are provided symmetrical to each other based on the first transfer unit 240. Some of the first process chambers 260 are placed along the lengthwise direction of the first transfer unit 240. Further, some of the first process chambers 260 are placed vertically stacked to each other along the third direction 16. That is, in one side of the first transfer unit 240, the first process chambers 260 may be arranged in A×B (A and B are natural number of 1 or above) array. Herein, A is the number of the first process chambers 260 which are provided along the first direction 12, and B is the number of the first process chambers 260 which are provided along the third direction 16. When four or six of the first process chambers 260 are provided in one side of the first transfer unit 240, the first process chambers 260 may be arranged in 2×2 or 3×2 arrays. The number of the first process chamber 260 may be increased or decreased. Unlike the above, the first process chamber 260 may be provided only on one side of the first transfer unit 240. Also, unlike the above the first process chamber 260 may be provided as a single layer at both sides of the first transfer unit 240.

The first buffer unit 220 is arranged between the first transfer frame 140 and the first transfer unit 240. The buffer unit provides a space for the substrate W to stay temporarily before transferring the substrate W between the first transfer unit 240 and the first transfer frame 140. The slot (not described) where the substrate places is provided inside of the first buffer unit 220, and the slot (not described) is provided with a plurality of numbers spaced apart from each other along the third direction 16. One side of the first buffer unit 220 facing the first transfer frame 140, and the other side of the first buffer unit 220 facing the first transfer frame 140 are opened.

The first transfer frame 140 transfers the substrate W between the first buffer unit 220 and the first carrier 130 seated on the first load port 120. In the first transfer frame 140, a first index rail 142 and a first index robot 144 are provided. The first index rail 142 is provided such that the lengthwise direction is parallel to the second direction 14. The first index robot 144 is installed on the first index rail 142, and move linearly along the first index rail 142 to the second direction 14. The first index robot 144 comprises a first base 144a, a first body 144b, and a first index arm 144c. The first base 144a is installed movably along the first index rail 142. The first body 144b is coupled to the first base 144a. The first body 144b is provided movably along the third direction 16 on the first base 144a. Also, the first body 144b is provided rotatable on the first base 144a. The first index arm 144c is coupled to the first body 144b, and is provided to move front and back with respect to the first body 144b. The first index arm 144c is provided with a plurality of numbers and to drive separately, respectively. The first index arms 144c are arranged vertically, i.e., spaced apart from each other along the third direction 16. Some of the first index arms 144c may be used when transferring the substrate W from the first process treating module 200 to the first carrier 130, and some of the first index arms 144c may be used when transferring the substrate W from the first carrier 130 to the first process treating module 130. This may prevent a particle generated from a wafer W before a treating process from sticking to a substrate W after a treating process, during the first index robot 144 carries in or carries out the substrate W.

The first transfer unit 240 transfers the substrate W between the first process chambers 260, and between the first buffer unit 220 and the first process chamber 260. A first guide rail 242 and a first main robot 244 are provided in the first transfer unit 240. The first guide rail 242 is placed such that the lengthwise direction is parallel with the first direction 12. The first main robot 244 is installed on the first guide rail 242, and moves linearly along the first direction 12 on the first guide rail 242. The first main robot 244 comprises a first base 244*a*, a first body 244*b*, and a first main arm 244*c*. The first base 244*a* is installed movably along the first guide rail 242. The first body 244*b* is coupled to the first base 244*a*. The first body 244*b* is provided movably along the third direction 16 on the first base 244*a*. Also, the first body 244*b* is provided rotatable on the first base 244*a*. The first main arm 244*c* is coupled to the first body 244*b*, and is provided to move front and back to the first body 244*b*. The first main arm 244*c* is provided with a plurality of numbers and provided to drive separately, respectively. The first main arms 244*c* are arranged vertically, i.e., spaced apart from each other along the third direction 16. The first main arm 244*c* used when transferring the substrate W from the first buffer unit 220 to the first process chamber 260, and the first main arm 244*c* used when transferring the substrate W from the first process chamber 260 to the first buffer unit 220 may be different.

The first process chamber 260 is provided to perform cleaning process to the substrate W. Each of the first process chambers 260 may have different structure based on kinds of cleaning process performed. According to one embodiment, the first process chambers 260 may have the same structure. According to another embodiment, the first process chambers 260 are separated to a plurality number of groups, and the first process chambers 260 of the same group may have the same structure, and the first process chambers 260 from different groups may have different structures. For example, when the first process chamber 260 is separated into two groups, the first process chambers 260 of the first group are provided in one side of the first unit 240, and first process chambers 260 of the second group are provided other side of the first transfer unit 240. According to another embodiment, the first process chambers 260 of the first group and the process chambers 260 of the second group may be provided both in one side and other side of first transfer unit 240 where the first process chambers 260 of the first group may be provided in the bottom layer and the first process chambers 260 of the second group may be provided in the top layer. The first group and the second group may be divided depending on a kinds of chemicals or kinds of cleaning process used.

The first process chamber 260 may be provided as a first chamber 300 which will be described later. Unlike this, the first process chamber 260 may be provided as both of the first chamber 300 and a second chamber 800 which will be described later.

Figure 4:
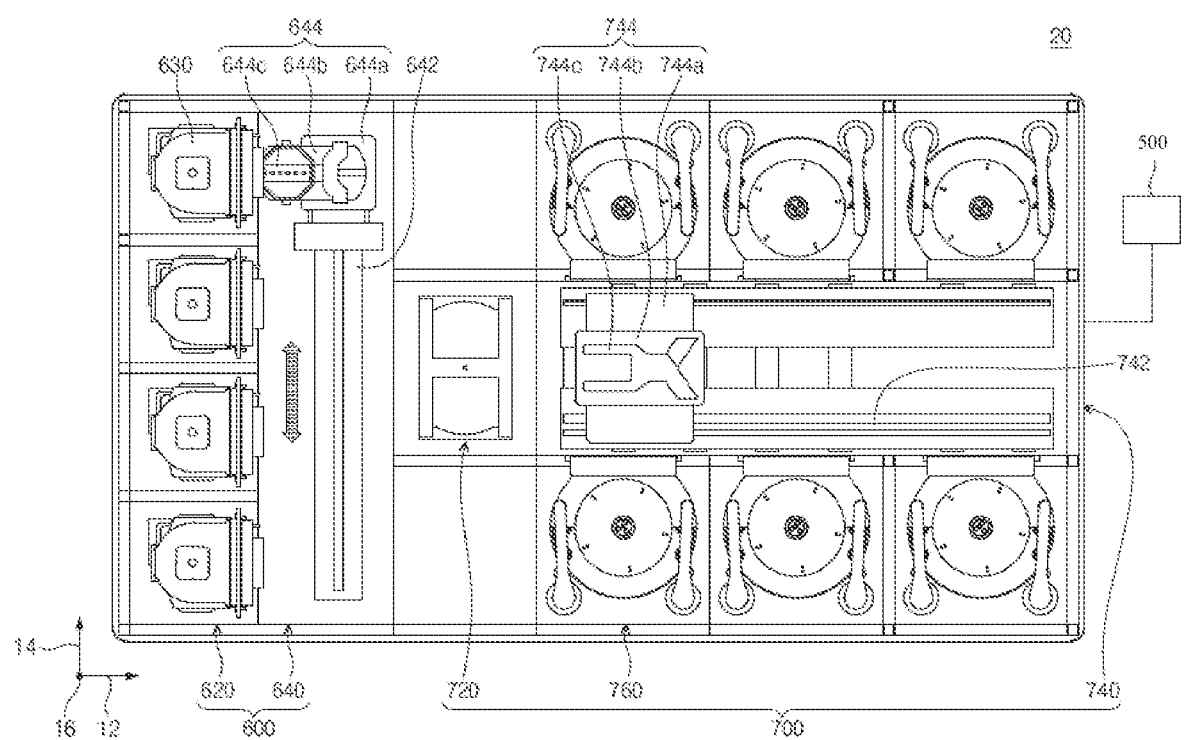
FIG. 4 is a plan view of an example of a second apparatus for treating a substrate of FIG. 2.

FIG. 4 is a plan view of an example of a second apparatus for treating a substrate of FIG. 2. Hereinafter, referring to FIG. 2, the second apparatus 20 for treating a substrate comprises a second index module 600 and a second process treating module 700. The second index module 600 includes a second load port 620 and a second transfer frame 640. The second load port 620, the second transfer frame 640, and the second process treating module 700 are sequentially arranged in a line. The second load port 620, the second transfer frame 640, and the second process treating module 700 are arranged along the first direction 12.

A second carrier 630 where a substrate W is stored is seated on the second load port 620. The second load port 620 is provided with a plurality of numbers and they are arranged in a line along the second direction 14. In the FIG. 2, as an example four second load ports 620 are provided. However, the number of second load ports 620 may be increased or decreased depending on a requirement like process efficiency and a foot print of the second process treating module 700. In the second carrier 630, a plurality of slots (not described) are provided to support an edge of the substrate W. The plurality of slots are provided along the third direction 16 and a plurality of substrates W are placed inside the second carrier 630 vertically stacked to each other along the third direction 16. As the second carrier 630 a front opening unified pod (FOUP) may be used.

The second process treating module 700 comprises a second buffer unit 720, a second transfer unit 740, and a second process chamber 760. The second transfer unit 740 is provided such that the lengthwise direction thereof is parallel with the first direction 12. The second process chambers 760 are provided in one side and the other side of the second transfer unit 740 along the second direction 14, respectively. The second process chamber 760 placed in one and the other sides of the second transfer unit 740 are provided symmetrical to each other based on the second transfer unit 740. Some of the second process chambers 760 are placed along the lengthwise direction of the second transfer unit 740. Also, some of the second process chambers 760 are placed vertically stacked to each other. That is, in one side of the second transfer unit 740, the second process chambers 760 may be arranged in A×B (A and B are natural number of 1 or above) array. Herein, A is the number of the second process chambers 760 which are provided along the first direction 12, and B is the number of the second process chambers 760 which are provided along the third direction 16. When a four or six of the second process chambers 760 are provided in one side of the second transfer unit 740, the second process chambers 760 may be arranged in 2×2 or 3×2 arrays. The number of the second process chamber 760 may be increased or decreased. Unlike the above, the second process chamber 760 may be provided only on one side of the second transfer unit 740. Also, unlike the above the second process chamber 760 may be provided as a single layer at both sides of the second transfer unit 740.

The second buffer unit 720 is arranged between the second transfer frame 640 and the second transfer unit 740. The buffer unit provides a space for the substrate W to stay temporarily before transferring the substrate W between the second transfer unit 740 and the second transfer frame 640. The slot (not described) where the substrate places is provided inside of the second buffer unit 720, and the slots (not described) are provided with a plurality of numbers spaced apart from each other along the third direction 16. One side of the second buffer unit 720 facing the second transfer frame 640, and the other side of the second buffer unit 720 facing the second transfer frame 640 are opened.

The second transfer frame 640 transfers the substrate W between the second buffer unit 720 and the second carrier 630 seated on the second load port 620. In the second transfer frame 640, a second index rail 642 and a second index robot 644 are provided. The second index rail 642 is provided such that the lengthwise direction is parallel to the second direction 14. The second index robot 644 is installed on the second index rail 642, and move linearly along the second index rail 642 to the second direction 14. The second index robot 644 comprises a second base 644*a*, a second body 644*b*, and a second index arm 644*c*. The second base 644*a* is installed movably along the second index rail 642. The second body 644*b* is coupled to the second base 644*a*. The second body 644*b* is provided movably along the third direction 16 on the second base 644*a*. Also, the second body 644*b* is provided rotatable on the second base 644*a*. The second index arm 644*c* is coupled to the second body 644*b*, and is provided to move front and back to the second body 644*b*. The second index arm 644*c* is provided with a plurality of numbers and to drive separately, respectively. The second index arms 644*c* are arranged vertically, i.e., spaced apart from each other along the third direction 16. Some of the second index arms 644*c* may be used when transferring the substrate W from the second process treating module 700 to the second carrier 630, and some of the second index arms 44*c* may be used when transferring the substrate W from the second carrier 630 to the second process treating module 700. This may prevent a particle generated from a substrate W before a treating process from sticking to the substrate W after a treating process, during the second index robot 644 carries in or carries out the substrate W.

The second transfer unit 740 transfers the substrate W between the second process chambers 760, and between the second buffer unit 720 and the second process chamber 760. A second guide rail 742 and a second main robot 744 are provided in the second transfer unit 740. The second guide rail 742 is placed such that the lengthwise direction is parallel with the first direction 12. The second main robot 744 is installed on the second guide rail 742, and moves linearly along the first direction 12 on the second guide rail 742. The second main robot 744 comprises a second base 744*a*, a second body 744*b*, and a second main arm 744*c*. The second base 744*a* is installed movably along the second guide rail 742. The second body 744*b* is coupled to the second base 744*a*. The second body 744*b* is provided movably along the third direction 16 on the second base 744*a*. Also, the second body 744*b* is provided rotatable on the second base 744*a*. The second main arm 744*c* binds to the second body 744*b*, and is provided to move front and back to the second body 744*b*. The second main arm 744*c* is provided with a plurality of numbers and provided to drive separately, respectively. The second main arms 744*c* are arranged vertically, i.e., spaced apart from each other along the third direction 16. The second main arm 744*c* used when transferring the substrate W from the second buffer unit 720 to the second process chamber 760, and the second main arm 744*c* used when transferring the substrate W from the second process chamber 760 to the second buffer unit 720 may be different.

The second process chamber 760 is provided to perform cleaning process to the substrate W. Each of the second process chambers 760 may have different structures based on kinds of cleaning process performed. According to one embodiment, the second process chambers 760 may have the same structure. According to another embodiment, the second process chambers 760 are separated to a plurality number of groups, and the second process chambers 760 belonging to the same group may have the same structure, and the second process chambers 760 belonging to different groups may have different structures. For example, when the second process chamber 760 is separated into two groups, the second process chambers 760 of a first group are provided in one side of the second unit 740, and the second process chambers 760 of a second group are provided other side of the second transfer unit 740. According to another embodiment, the second process chambers 760 of the first group and the second process chambers 760 of the second group may be provided both in one side and the other side of the second transfer unit 740 where the second process chambers 760 of the first group are provided in bottom layer and the second process chambers 760 of the second group are provided in the top layer. Each of the second process chambers 760 of the first and the second groups may be divided depending on a kinds of chemicals or kinds of cleaning process used.

The second process chamber 760 may be provided as a second chamber 800 which will be described. Unlike this, the second process chamber 760 may be provided with both the second chamber 800 and a first chamber 300 which will be described later.

A controller 500 controls the first transfer unit 240 and the second transfer unit 740. The controller 500 controls the first transfer unit 240 so that the substrate is supported by a first chuck pin 340 when treating the substrate with the first treatment liquid. The controller 500 controls the second transfer unit 740 so that the substrate is supported by a second chuck pin 840 when treating the substrate with the second treatment liquid. Herein, the first treatment liquid may have higher temperature than the second treatment liquid.

Figure 5:
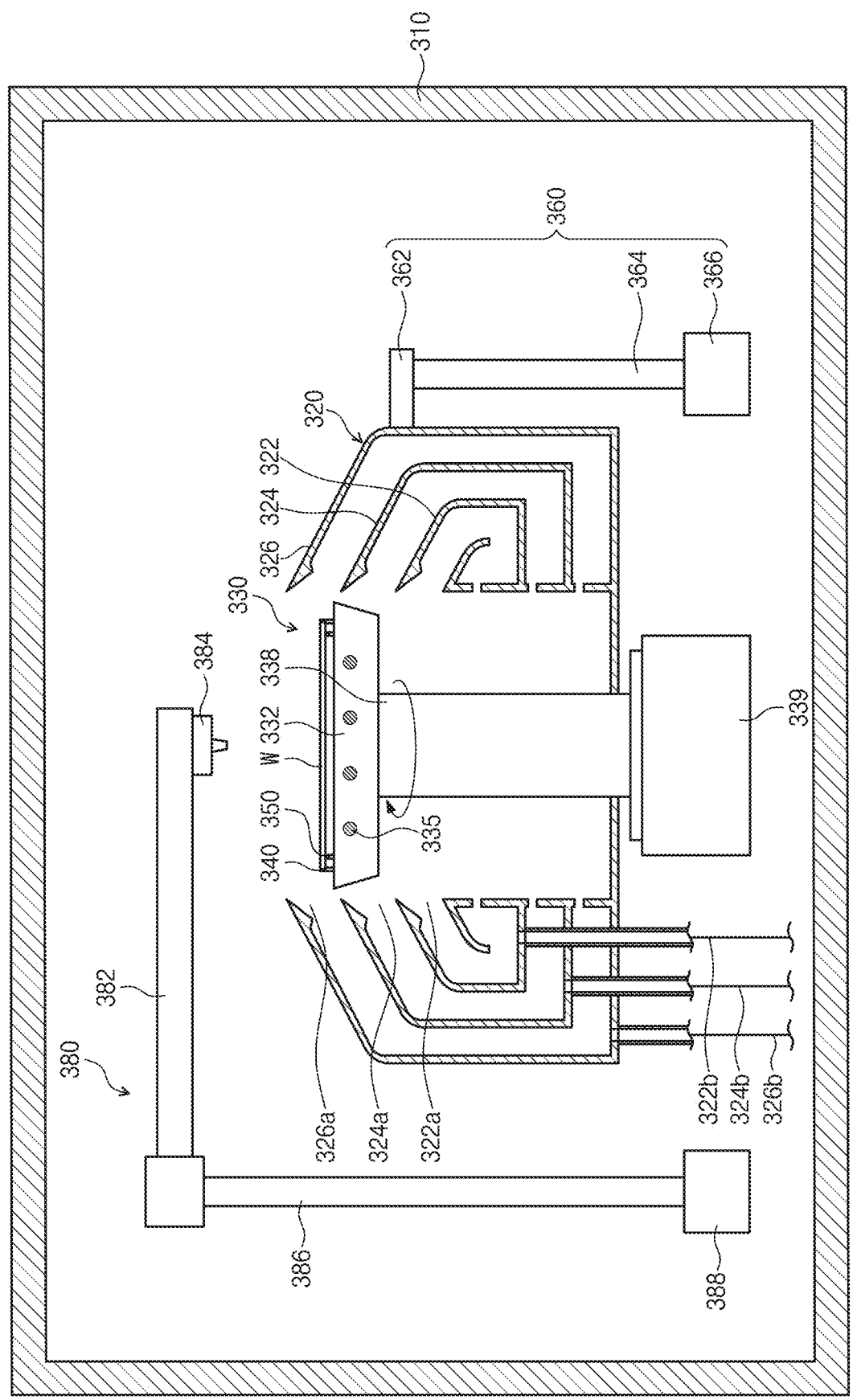
FIG. 5 is a plan view of a first chamber of FIG. 3.

FIG. 5 is a plan view of a first chamber of FIG. 3. Hereinafter, referring to FIG. 5, the first chamber 300 comprises a first housing 310, a first container 320, a first spin head 330, a first heating unit 339, a first elevator unit 360, and a first ejection unit 380.

The first housing 310 provides a space therein. The first container 320 is placed in the first housing 310.

The first container 320 provides a treating space where a substrate treating process is performed. The first container 320 is provided with an upper side being open. The first container 320 comprises a first inner collecting container 322, a first middle collecting container 324, and a first outer collecting container 326. Each collecting containers 322, 324, 326 collects a treatment liquid that are different from each other among treatment liquids used in a process. The first inner collecting container 322 is provided with a ring shape surrounding the first spin head 330. The first middle collecting container 324 is provided with a ring shape surrounding the first inner collecting container 322. The first outer collecting container 326 is provided with a ring shape surrounding the first middle collecting container 324. An inner space 322*a* of the first inner collecting container 322, an interspace 324*a* between the first inner collecting container 322 and the first middle collecting container 324, and a interspace 326*a* between the first middle collecting container 324 and the first outer collecting container 326 may function as a inlet where respective treatment liquid flows into the first inner collecting container 322, the first middle collecting container 324, and the first outer collecting container 326, respectively. To each of the collecting containers 322, 324, 326, collecting lines 322*b*, 324*b*, 326*b* are connected which are extended vertically downward from the bottom of the collecting containers 322, 324, 326, respectively. Each collecting lines 322*b*, 324*b*, 326*b* emits the treatment liquid inflow through the each collecting containers 322, 324, 326, respectively. The emitted treatment liquid may be reused through a treatment liquid regeneration system (not described) of outside.

The first spin head 330 is placed in the first container 320. The first spin head 330 supports the substrate W and rotates the substrate W during the substrate treating process. The first spin head 330 comprises a first supporting plate 332, a first supporting pin 350, a first chuck pin 340, a heating unit 335, and a first supporting shaft 339. The first supporting plate 332 has an upper surface usually provided as a circular shape, when viewed from a top side. At the bottom of the first supporting plate 332 the first supporting shaft 339 rotatable by a first motor 339 is fixedly connected. The first supporting pin 350 is provided with a plurality of numbers. The plurality of supporting pins 350 are provided and spaced apart from each other on edge of the upper surface of the first supporting plate 332 and protrude upward from the first supporting plate 332. The first supporting pins 334 are generally arranged to have a ring shape. The first supporting pin 350 supports the back side of the substrate W to be spaced apart from the upper surface of the first supporting plate 332.

The heating unit 335 is placed in the first spin head 330. The heating unit 335 is placed in the first supporting plate 332. The heating unit 335 heats the substrate W which is placed on the supporting plate 332. In an example, the heating unit 335 may be provided as a lamp that could make a heat. In an example, the lamp may be provided as an IR lamp.

Figure 13:
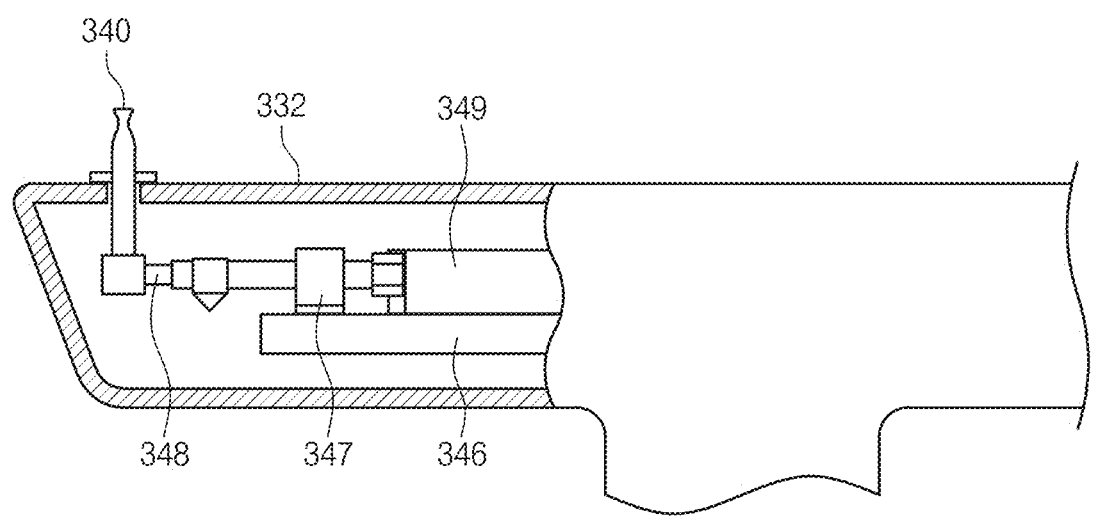
FIG. 13 shows some part of a first spin head of FIG. 5.

FIG. 13 shows some part of a first spin head of FIG. 5. Referring to FIG. 13, a first chuck pin 340 is installed on a chuck rod 348. The first chuck pin 340 is placed at the end of the chuck rod 348. At the end of the chuck rod 348, the first chuck pin 340 is provided to protrude above the top surface of the first supporting pin 332. The first chuck pin 340 is provided with a plurality of numbers. The first chuck pin 340 may be provided with the same number as the chuck rod 348. In an example, six first chuck pins 340 may be provided. The first chuck pin 340 is placed further than the first supporting pin 350 from the center of the first supporting plate 332. The first chuck pin 340 supports a lateral portion of the substrate W so that the substrate W does not deviate from a right position to a side direction when the first spin head 330 rotates. The first chuck pin 340 is provided to move between a supporting position and a standby position to support and release the side (lateral) portion of the substrate W respectively. The standby position is further apart from the center of the first supporting plate 332 than the supporting position. When the substrate W is loaded in or unloaded from the first spin head 330, the first chuck pin 340 is placed on the standby position, and when performing a process to the substrate, the first chuck pin 340 is placed on the supporting position. On the supporting position, the first chuck pin 340 is contacted with the lateral portion of the substrate.

In the first supporting plate 332, a base 346 is placed. The base 346 is provided as a plate of a circular shape. The base 346 is provided as a material containing a conductive material. In an example, the base 346 may be provided with a resin or aluminum material.

A cam 349 is installed on the base 346. The cam 349 is placed on top of the base 346. A center of the cam 349 may be placed on top of a center of the base 346. The cam 349 may be provided with a smaller area than the base 346. The cam 349 forms a circular shape when viewed from a top side. A protrusion part (not described) is formed in the cam 349. The protrusion part is provided with a plurality of numbers. In an example, the number of protrusion part may be the same as the number of chuck rod 348. The cam 349 may be connected with a cam driver (not described). The cam driver (not described) rotates the cam 349. The protrusion part pushes the chuck rod 348 to outer direction of the base 346 so that the chuck rod 348 may move linearly when the cam 349 rotates.

The chuck rod 348 moves linearly according to a rotation of the cam 349. The chuck rod 348 is located at a radius direction of the base 346. A lengthwise direction of the chuck rod 348 may be a radius direction of the base 346. One end of the chuck rod 348 may be contacted with the protrusion part of the cam 349. The protrusion part pushes the one end of the chuck rod 348 according to a rotation of the cam 349. The movement of the chuck rod 348 renders the first chuck pin 340 in the standby position or the supporting position according to the rotation of the cam 349. The supporting position is a position before the cam 349 rotates. The standby position is a position after the cam 349 rotates, thereby liner movement of the chuck rod 348. The supporting position is a position where the first chuck pin 340 supports a lateral part of the substrate W. The standby position is a position where the first chuck pin 340 does not support the substrate W.

The chuck rod 348 is provided with a plurality of numbers. In an example, six chuck rods 348 may be provided. A plurality of chuck rods 348 are placed on a radius direction of the base 346m and each of the chuck rods 348 may be spaced apart from each other. The chuck rod 348 and the cam 349 are placed at the same plane. The chuck rod 348 is placed at the top of the base 346.

The chuck rod 348 may be provided with a metal material containing a conductive material. In an example, the chuck rod 348 may be provided with a resin or aluminum material. On the other hand, the chuck rod 348 may be provided with a conductive material having conductivity.

A rod guide 347 guides a linear movement of the chuck rod 348. A through-hole (not described) is formed in the rod guide 347. The chuck rod 348 is inserted in the through-hole. The rod guide 347 may have a rectangular shape, when viewed from a top side. The rod guide 347 is placed such that its lengthwise direction is parallel to a tangent direction of the cam 349. The rod guide 347 is placed outer side of the cam 349. The rod guide 347 is installed on the base 346. The rod guide 347 is placed on top of the base 346. The rod guide 347 may be provided with a material containing a conductive material. In an example, the rod guide 347 may be provided with a material containing aluminum or a resin.

Figure 6:
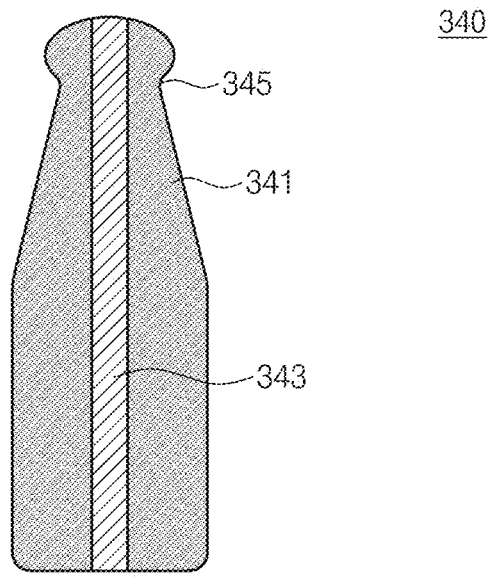
FIG. 6 is a cross sectional view of a first chuck pin of FIG. 5.

FIG. 6 is a cross sectional view of a first chuck pin of FIG. 5. Hereinafter, referring to FIG. 6, the first chuck pin 340 comprises a first outer body 341 and a first inner body 343 that are provided with different materials from each other. The first outer body 341 may be provided with a first material. The first outer body 341 has a first groove 345 at a later side thereof where an end part of the substrate W is contacted with. The first outer body 341 may be provided to surround a lateral part and optionally a top of the first inner body 343. The first inner body 343 is placed inside of the first outer body 341. The first inner body 343 may be provided to be inserted in the first outer body 341. The first inner body 343 is provided as a rod shape. The first inner body 343 is provided with a second material. One of the first material and the second material may be provided with a material having lower heat conductivity and better thermal resistance than the other of the first material and the second material. In an example, the first material may be provided with a ceramic material. In an example, the ceramic material may be provided with a silicon carbide and a resin material. The second material may be provided as a resin material. In an example, the resin material may be provided as a perfluoralkoxy (PFA). The ceramic material has lower heat conductivity and better thermal resistance than the resin material.

Different from the above examples, the first outer body 341 may be provided with the second material, and the first inner body 343 may be provided with the first material.

Figure 7:
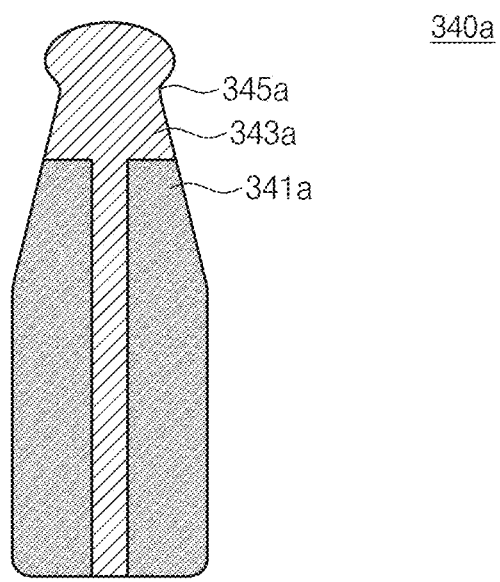
FIGS. 7 to 11 are other embodiments of the first chuck pin of the FIG. 6.

FIGS. 7 to 11 are another embodiments of the first chuck pin of the FIG. 6. Referring to these figures, a first chuck pin 340a of FIG. 7 comprises a first outer body 341a provided with the first material and a first inner body 343a provided with the second material. The first chuck pin 340a of FIG. 7 is provided similarly to the first chuck pin 340 of FIG. 6. A top of the first inner body 343a is placed above a top of the first outer body 341a. The first outer body 341a is provided to surround a lateral part of the first inner body 343a. A first groove 345a where an end of the substrate W is contacted is formed at the first inner body 343a.

Figure 8:
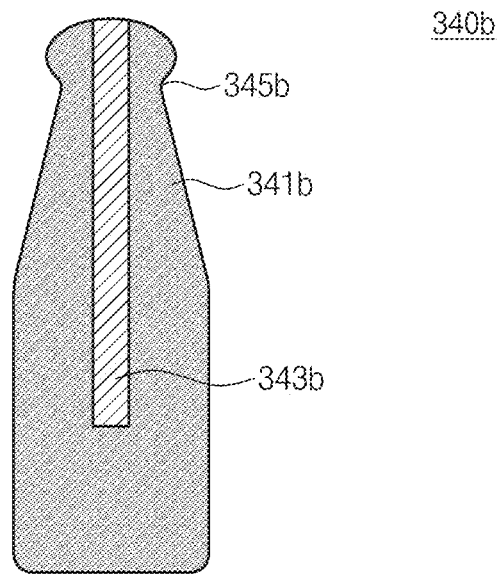

A first chuck pin 340b of FIG. 8 comprises a first inner body 343b provided with the first material and a first outer body 341b provided with the second material. The first chuck pin 340b of FIG. 8 is provided similarly to the first chuck pin 340 of FIG. 6. However, the first inner body 343b is provided such that its lengthwise is shorter than the first inner body 343 of FIG. 6. A bottom of the first inner body 343b may be placed inside of the first outer body 341b. Namely, the bottom of the first inner body 343b is higher in level than the bottom of the first outer body 341b.

Figure 9:
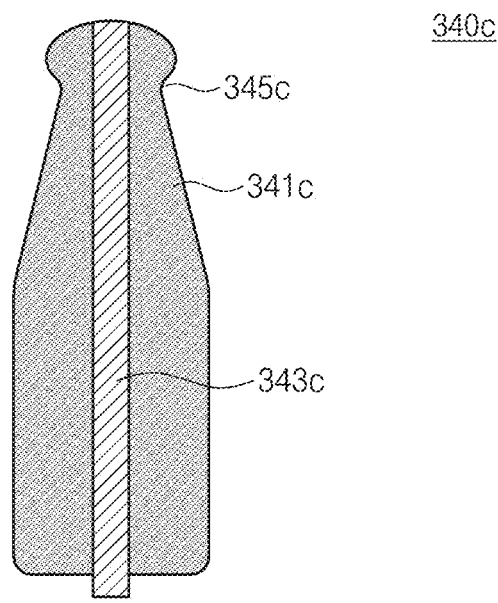

A first chuck pin 340c of FIG. 9 comprises a first outer body 341c provided with the first material and a first inner body 343c provided with the second material. The first chuck pin 340c of FIG. 9 is provided similarly to the first chuck pin 340 of FIG. 6. However, a bottom of the first inner body 343c is provided to protrude to outside of the first outer body 341c. Namely, the bottom of the first inner body 343b is lower in level than the bottom of the first outer body 341b.

Figure 10:
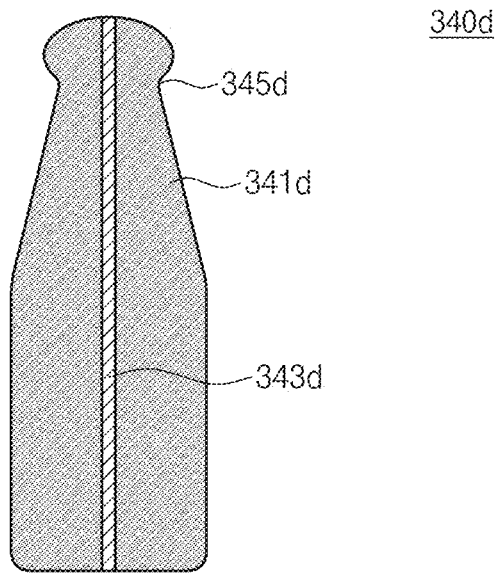

A first chuck pin 340d of FIG. 10 comprises a first outer body 341d provided with the first material and a first inner body 343d provided with the second material. The first chuck pin 340d of FIG. 10 is provided similarly to the first chuck pin 340 of FIG. 6. However, the first chuck pin 340d of FIG. 10 is provided such that a cross sectional area ratio of the first inner body 343d to the first outer body 341d is smaller than a cross sectional area ratio of the first inner body 343 to the first outer body 341 of FIG. 6. A cross sectional area of the first inner body 343d is smaller than a cross sectional area of the first inner body 343 of FIG. 6.

Figure 11:
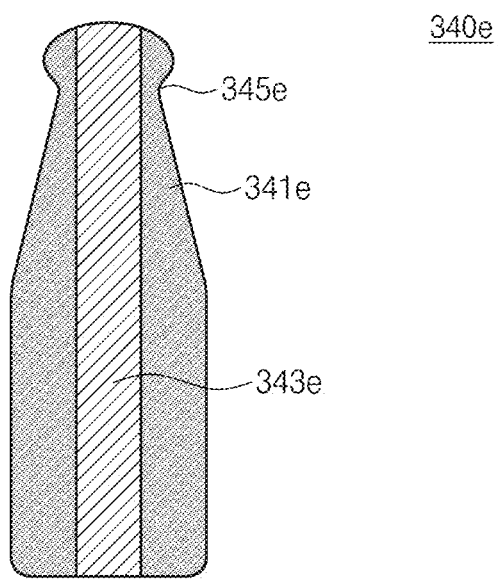

A first chuck pin 340e of FIG. 11 comprises a first outer body 341e provided with the first material and a first inner body 343e provided with the second material. The first chuck pin 340e of FIG. 11 is provided similarly to the first chuck pin 340 of FIG. 6. However, the first chuck pin 340e of FIG. 11 is provided such that a cross sectional area ratio of the first inner body 343e to the first outer body 341e is greater than a cross sectional area ratio of the first inner body 343 to the first outer body 341 of FIG. 6. A cross sectional area of the first inner body 343e is greater than a cross sectional area of the first inner body 343 of FIG. 6.

Figure 12:
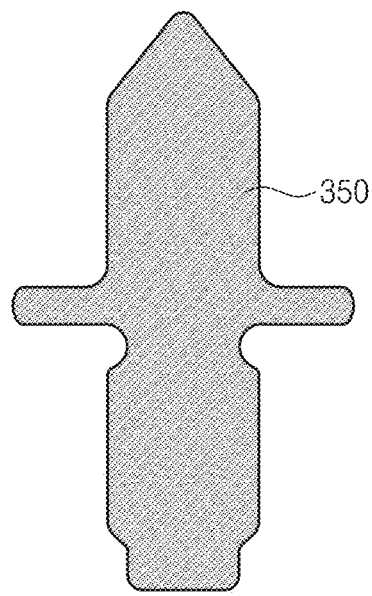
FIG. 12 is a cross sectional view of a first supporting pin of FIG. 5.

FIG. 12 is a cross sectional view of a first supporting pin of FIG. 5. Hereinafter, referring to FIG. 12, the first supporting pin 350 may be provided with a single material when treating the substrate W with the treatment liquid having a high temperature. In an example, the first supporting pin 350 may be provided with the first material. In an example, the first material may be provided with a ceramic material. However, the first supporting pin 350 may be provided with a material among various embodiments of dual material of a second supporting pin 850 when treating the substrate W by supplying the treatment liquid that is not a high temperature treatment liquid.

Referring back to FIG. 5, the first elevator unit 360 moves the first container 320 linearly to up and down direction. As the first container 320 moves up and down, a height of the first container 320 relative to the first spin head 330 is changed. The first elevator unit 360 comprises a first bracket 362, a first moving shaft 364, and a first driver 366.

The first bracket 362 is fixedly installed on outer wall of the first container 320. To the first bracket 362, the first moving shaft 364 moving up and down direction by the first driver 366 is fixedly coupled. When the substrate W is placed on the first spin head 330 or when lifted from the first spin head 330, the first container 320 descends such that the first spin head 330 protrudes from the first container 320. Also, during processing, the height of the first container 320 is controlled such that the treatment liquid flows into the predetermined collecting containers 322, 324, 326 depending on a kind of treatment liquid supplied in the substrate W.

In an example, when treating the substrate W with the first treatment liquid, the substrate W is placed on a height corresponding to the inner space 322a of the first inner collecting container 322. Also, when treating the substrate W with the second treatment liquid and the third treatment liquid, the substrate W is placed on a height corresponding to the interspace 324a between the first inner collecting container 322 and the first middle collecting container 324, and the interspace 326a between the first middle collecting container 324 and the first outer collecting container 326, respectively. Different from the above, the first elevator unit 360 may move the first spin head 330 up and down direction instead of the first container 320.

The first ejection unit 380 supplies the treatment liquid to the substrate W when treating the substrate W.

The first ejection unit 380 supplies a liquid to the substrate W placed in the first spin head 330. The first ejection unit 380 comprises a first nozzle support 382, a first nozzle 384, a first supporting shaft 386, and a first driver 388.

The first supporting shaft 386 is provided such that its lengthwise direction is parallel with the third direction 16, and the first driver 388 is coupled at the bottom of the first supporting shaft 386. The first driver 388 rotates and elevates the first supporting shaft 386 up and down. The first nozzle support 382 is perpendicularly coupled to one end of the first supporting shaft 386 which is opposite the other end of the first supporting shaft 386 to which the first driver 388 is coupled. The first nozzle 384 is installed at the bottom of an end of the first nozzle support 862. The first nozzle 384 is moved to a processing position and a standby position by the first driver 388. The processing position is where the first nozzle 384 is located vertically above the first container 320, and the standby position is where the first nozzle 384 is not vertically above the first container 320, e.g. out of the processing position. The first nozzle 384 supplies a liquid to the substrate W by supplying a liquid from a liquid supply member 370.

The first ejection unit 380 may be provided with one or a plurality of numbers. When the first ejection unit 380 is provided with plurality numbers, a chemical, a rinse liquid, or an organic solvent may be provided through different first ejection units 380. The rinse liquid may be deionized water, and the organic solvent may be a mixed solution of an inert gas and an isopropyl alcohol gas or an isopropyl alcohol liquid.

The first ejection unit 380 may supply the first treatment liquid to the substrate. In an example, the first treatment liquid may supply a high temperature chemical to the substrate. In an example, the chemical may be provided with a phosphoric acid. In an example, a temperature of the treatment liquid may be 150-220° C.

Figure 14:
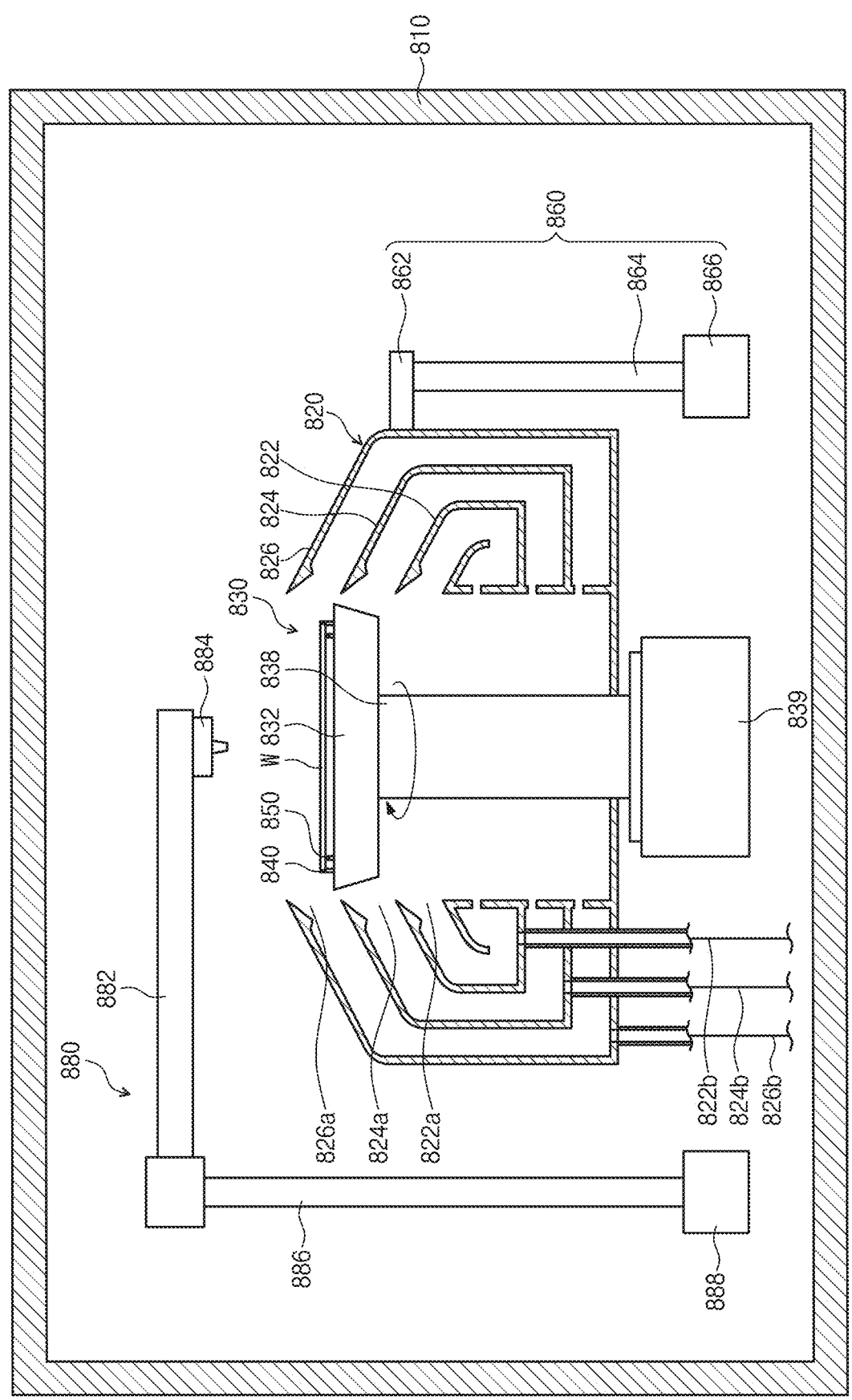
FIG. 14 is a cross sectional view of a second chamber of FIG. 4.

FIG. 14 is a cross sectional view of a second chamber of FIG. 4. Hereinafter, referring to FIG. 14, the second chamber 800 comprises a second housing 810, a second container 820, a second spin head 830, a second elevator unit 860, and a second ejection unit 880.

The second housing 810 provides a space therein. The second container 812 is placed in the second housing 810.

The second container 820 provides a treating space where a substrate treating process is performed. The second container 820 is provided with upper side being open. The second container 820 comprises a second inner collecting container 822, a second middle collecting container 824, and a second outer collecting container 826. Each collecting containers 822, 824, 826 collects a treatment liquid that are different from each other among treatment liquids used in a process. The second inner collecting container 822 is provided as a ring shape surrounding the second spin head 830. The second middle collecting container 824 is provided as a ring shape surrounding the second inner collecting container 822. The second outer collecting container 826 is provided as a ring shape surrounding the second middle collecting container 824. An inner space 822*a* of the second inner collecting container 822, a second interspace 724*a* between the second inner collecting container 822 and the second middle collecting container 824, and a interspace 826*a* between the second middle collecting container 824 and the second outer collecting container 826 may function as a inlet where treatment liquid flows into the second inner collecting container 822, the second middle collecting container 824, and the second outer collecting container 826, respectively. To each of the collecting containers 822, 824, 826, collecting lines 822*b*, 824*b*, 826*b* are connected which are extended vertically downward from the bottom of the collecting containers 822, 824, 826, respectively. Each collecting lines 822*b*, 824*b*, 826*b* emit the treatment liquid inflow through the each collecting containers 822, 824, 826, respectively. The emitted treatment liquid may be reused through a treatment liquid regeneration system (not described) of outside.

The second spin head 830 is placed in the second container 820. The second spin head 830 supports the substrate W and rotates the substrate W during the substrate treating process. The second spin head 830 comprises a second supporting plate 832, a second supporting pin 850, a second chuck pin 840, and a second supporting shaft 838. The second supporting plate 832 has an upper surface usually provided as a circular form, when viewed from a top side. At the bottom of the second supporting plate 832 the second supporting shaft 838 rotatable by a second motor 839 is fixedly connected. The second supporting pin 850 is provided with a plurality of numbers. The plurality of second supporting pins 850 are provided and spaced apart from each other at the edge of the upper surface of the second supporting plate 832 and protrude upward from the second supporting plate 832. The second supporting pins 850 are generally arranged to have a ring shape. The second supporting pin 850 supports the back side of the substrate W to be spaced apart from the upper surface of the second supporting plate 832.

The second chuck pin 840 is provided with a plurality of numbers. The second chuck pin 840 is placed further than the second supporting pin 850 from the center of the second supporting plate 832. The second chuck pin 840 is provided to protrude above the second supporting plate 832. The second chuck pin 840 supports a lateral portion of the substrate W so that the substrate W does not deviate from a right position to a side direction when the second spin head 830 rotates. The second chuck pin 840 is provided to move between a supporting position and a standby position. The standby position is further apart from the center of the second supporting plate 832 than the supporting position. When the substrate W is loaded in or unloaded from the second spin head 830, the second chuck pin 840 is placed on the standby position, and when performing a process to the substrate, the second chuck pin 840 is placed on the supporting position. At the supporting position, the second chuck pin 840 is contacted with the lateral portion of the substrate.

Figure 15:
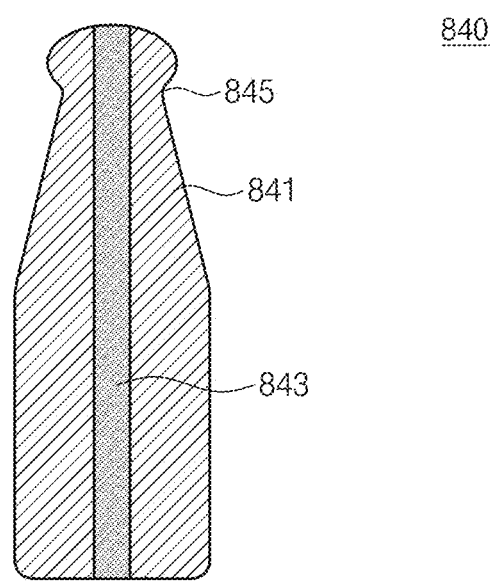
FIG. 15 is a cross sectional view of a second chuck pin of FIG. 14.
Figure 16:
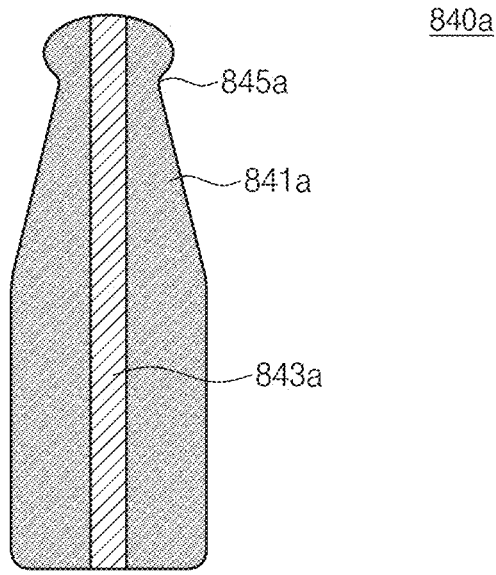
FIGS. 16 to 22 show other embodiments of the second chuck pin of FIG. 15.

FIG. 15 is a cross sectional view of the second chuck pin 840 of FIG. 14. Hereinafter, referring to FIG. 15, the second chuck pin 840 comprises a second outer body 841 and a second inner body 843 that are provided with different materials from each other. The second outer body 841 is placed outside of the second chuck pin 840. The second outer body 841 may be provided as the second material. A second groove 845 where an end part of the substrate W is contacted with is formed at a lateral part of the second outer body 841. The second outer body 841 may be provided to surround a lateral part and optionally a top of the second inner body 843. The second inner body 843 is placed inside of the second outer body 841. The second inner body 843 may be provided as to be inserted in the second outer body 841. The second inner body 843 is provided with a rod shape. The second inner body 843 is provided with the second material. Any one of the first material and the second material may be provided with a material having lower heat conductivity and better thermal resistance than the other of the first material and the second material. In an example, the second material may be provided with a ceramic material. In an example, the ceramic material may be provided with a silicon carbide material. The first material may be provided as a resin material. In an example, the resin material may be provided as a perfluoralkoxy (PFA). The ceramic material has lower heat conductivity and better thermal resistance than the resin material.

FIGS. 16 to 22 show other embodiments of the second chuck pin of FIG. 15. Hereinafter, referring to FIG. 16, a second chuck pin 840*a* is provided similarly to the second chuck pin 840 of FIG. 15. However, a second outer body 841*a* is provided as the first material, and a second inner body 843*a* is provided as the second material.

In an example, the first material may be provided as a ceramic material. In an example, the ceramic material may be provided with a silicon carbide material. The second material may be provided as a resin material. In an example, the resin material may be provided as a perfluoralkoxy (PFA). The ceramic material has lower heat conductivity and better thermal resistance than the resin material.

Figure 17:
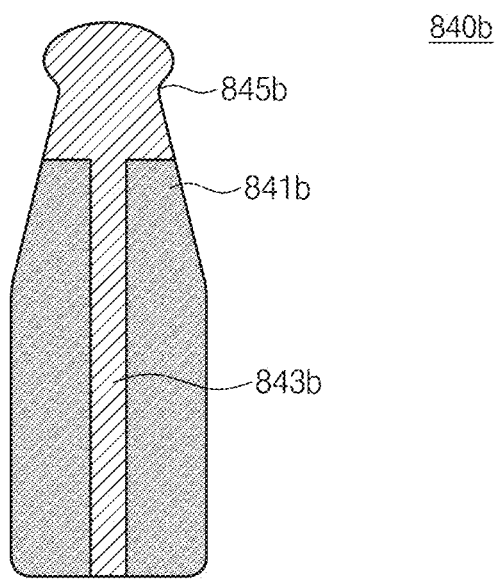

A second chuck pin 840*b* of FIG. 17 comprises a second outer body 841*b* provided with the second material and a second inner body 843*b* provided with the first material. The second chuck pin 840*b* of FIG. 17 is provided similarly to the second chuck pin 840*a* of FIG. 16. A top of the second inner body 843*b* may be placed above the top of the second outer body 841*b*. The second outer body 841*b* is provided to surround a lateral part of the second inner body 843*b*. The second inner body 843*b* has a second groove 845*b* where an end of the substrate W is contacted with.

Figure 18:
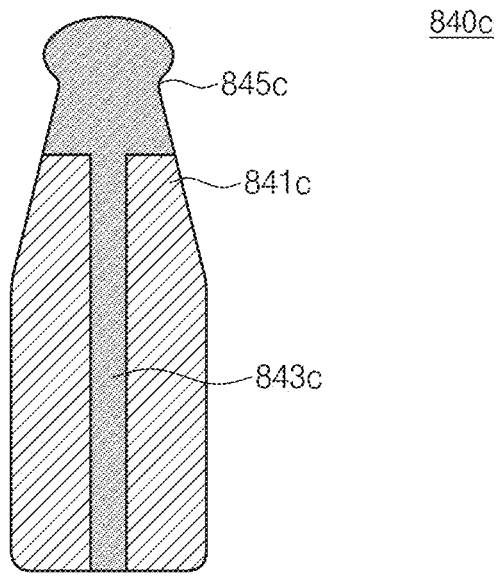

A second chuck pin 840*c* of FIG. 18 comprises a second outer body 841*c* provided with the first material and a second outer body 843*c* provided with the second material. The second chuck pin 840*c* of FIG. 18 is provided similarly to the second chuck pin 840*b* of FIG. 17.

Figure 19:
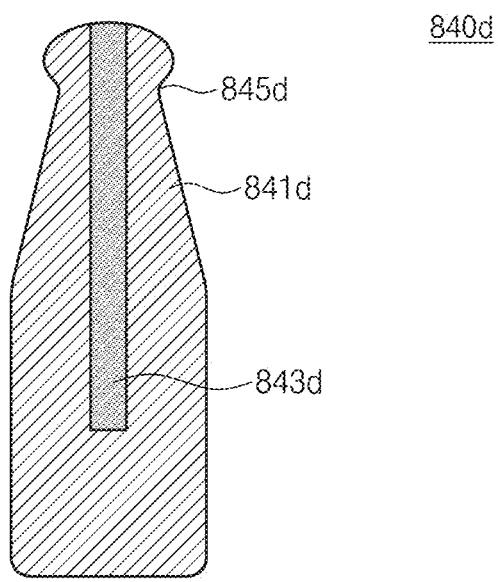

A second chuck pin 840*d* of FIG. 19 comprises a second outer body 841*d* provided with the second material and a second inner body 843*d* provided with the first material. The second chuck pin 840*d* of FIG. 19 is provided similarly to the second chuck pin 840*a* of FIG. 16. However, the second inner body 843*d* is provided such that its lengthwise is shorter than the second inner body d43 of FIG. 15. A bottom of the second inner body 343*d* may be placed inside of the second outer body 841*d*.

Figure 20:
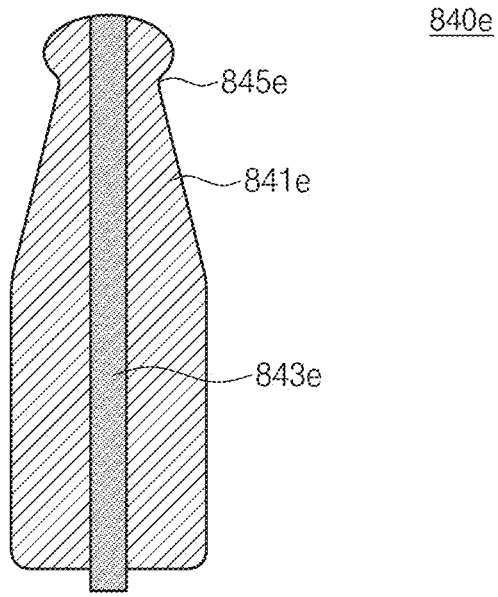

A second chuck pin 840*e* of FIG. 20 comprises a second outer body 841*e* provided with the second material and a second inner body 843*e* provided with the first material. The second chuck pin 840e of FIG. 20 is provided similarly to the second chuck pin 840 of FIG. 15. However, a bottom of the second inner body 843e is provided to protrude to outside of the second outer body 841e.

Figure 21:
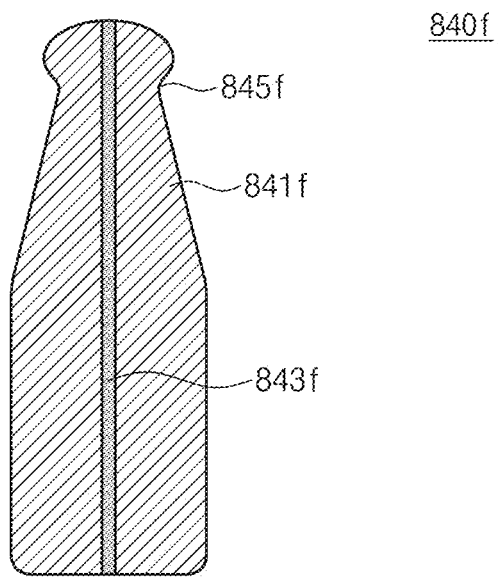

A second chuck pin 840f of FIG. 21 comprises a second outer body 841f provided with the second material and a first inner body 843f provided with the first material. The second chuck pin 840f of FIG. 21 is provided similarly to the second chuck pin 840 of FIG. 15. However, the second chuck pin 840f of FIG. 21 is provided such that a cross sectional area ratio of the second inner body 343f to the second outer body 341f is smaller than a cross sectional area ratio of the second inner body 843 to the second outer body 841 of FIG. 15. That is, a cross sectional area of the second inner body 843f of FIG. 21 is smaller than a cross sectional area of the second inner body 843 of FIG. 15.

Figure 22:
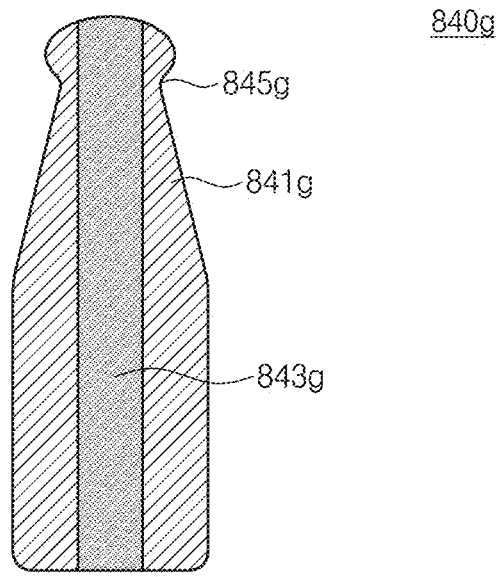

A second chuck pin 840g of FIG. 22 comprises a second outer body 841g provided with the second material and a first inner body 843g provided with the first material. The second chuck pin 840g of FIG. 22 is provided similarly to the second chuck pin 840 of FIG. 15. However, the second chuck pin 840g of FIG. 22 is provided such that a cross sectional area ratio of the second inner body 843g to the second outer body 841g is greater than a cross sectional area ratio of the second inner body 843 to the second outer body 841 of FIG. 12. That is, a cross sectional area of the second inner body 843g of FIG. 22 is greater than a cross sectional area of the second inner body 843 of FIG. 15.

In the embodiments with reference to FIGS. 18 to 22, the second outer body 841 is provided with the second material and the second inner body 843 is provided with the first material. However, the second outer body 841 may be provided with the first material and the second inner body 843 may be provided with the second material.

Figure 23:
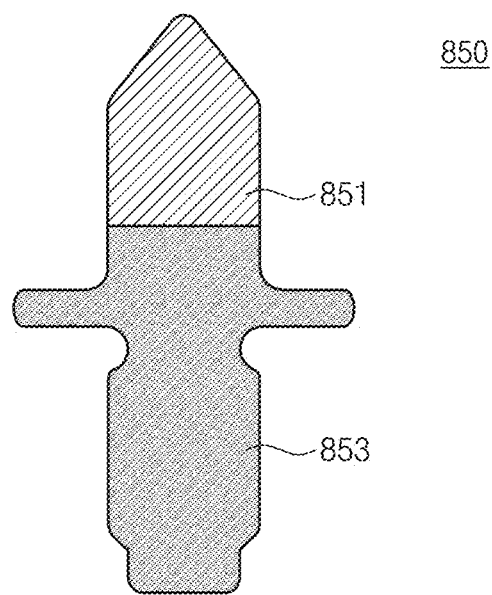
FIG. 23 is a cross sectional view of the second supporting pin of FIG. 14.

FIG. 23 is a cross sectional view of the second supporting pin of FIG. 14. Hereinafter, referring to FIG. 23, the second supporting pin 850 comprises a first body 851 and a second body 853. A top of the first body 851 is contacted with the substrate W. The first body 851 may be provided as a shape such that its cross sectional area is reduced as going to the top. The first body 851 may be provided as the second material. The second body 853 is coupled with a bottom of the first body 851. The second body 853 may be provided with the first material.

Any one of the first material and the second material may be provided with a material having lower heat conductivity and better thermal resistance than the other of the first material and the second material. In an example, the first material may be provided with a ceramic material. In an example, the ceramic material may be provided with a silicon carbide material. The second material may be provided as a resin material. In an example, the resin material may be provided as a perfluoralkoxy (PFA). The ceramic material has lower heat conductivity and better thermal resistance than the resin material.

Figure 24:
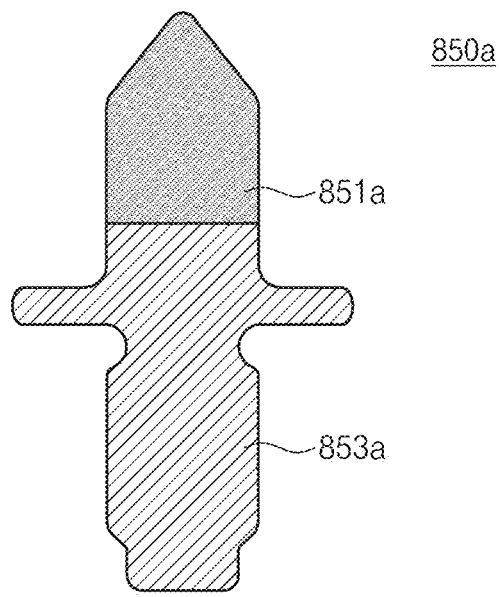
FIGS. 24 to 31 shows other embodiments of the second supporting pin of FIG. 23.

FIGS. 24 to 31 shows other embodiments of the second supporting pin of FIG. 23. Referring to FIG. 24, a second supporting pin 850a is provided similarly to the second chuck pin 850 of FIG. 23. However, a body 851a of the second supporting pin 850a is provided with the first material. A second body 853a is provided with the second material.

Figure 25:
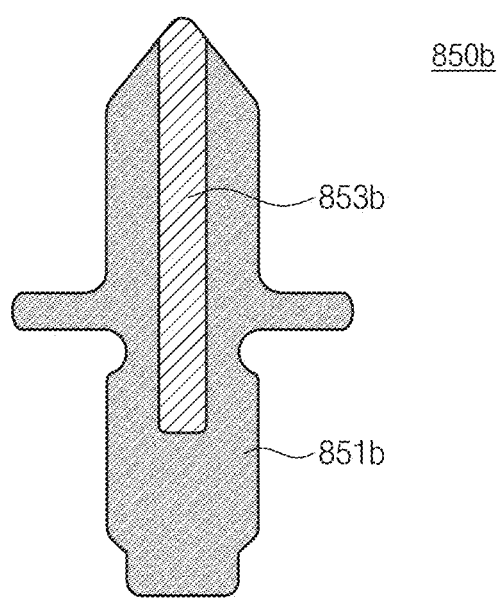

A second supporting pin 850b of FIG. 25 comprises a first body 851b provided with the first material and a second body 853b provided with the second material. A first body 853b is provided to surround a lateral part and optionally a top of the second body 851b. The second body 853b is inserted in the first body 851b and is provided with a rod shape.

Figure 26:
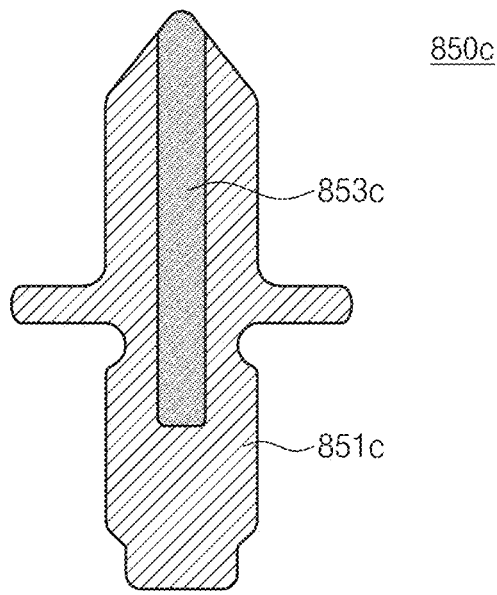

A second supporting pin 850c of FIG. 26 is provided similarly to the second supporting pin 850b of FIG. 25. A first body 851c of the second supporting pin 850c is provided with the second material. A second body 853c is provided with the first material.

Figure 27:
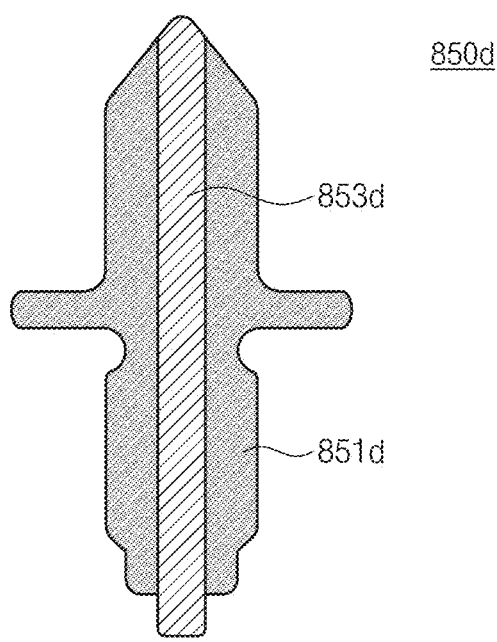

A second supporting pin 850d of FIG. 27 is provided similarly to the second supporting pin 850b of FIG. 25. A bottom of a second body 853d of the second supporting pin 850d is provided to protrude to outside of a first body 851d.

Figure 28:
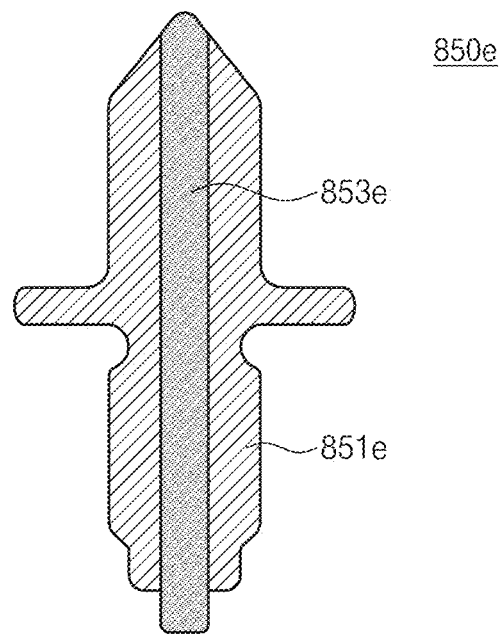

A second supporting pin 850e of FIG. 28 is provided similarly to the second supporting pin 850d of FIG. 27. The second supporting pin 850e comprises a first body 851e provided with the second material and a second body 853e provided with the first material.

Figure 29:
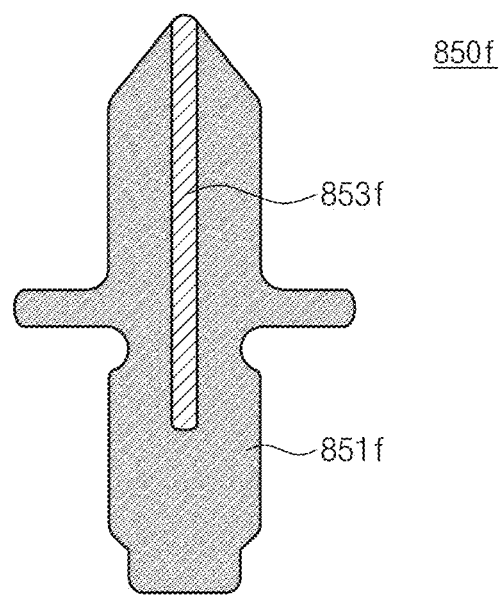

A second supporting pin 850f of FIG. 29 is provided similarly to the second supporting pin 850b of FIG. 25. However, the second supporting pin 850f is provided such that a cross sectional area ratio of a second body 853f to a first body 851f is smaller than a cross sectional area ratio of the second body 853b to the first body 851b of FIG. 25. A cross sectional area of the second body 853f of FIG. 29 is smaller than a cross sectional area of the second body 853b of FIG. 25.

Figure 30:
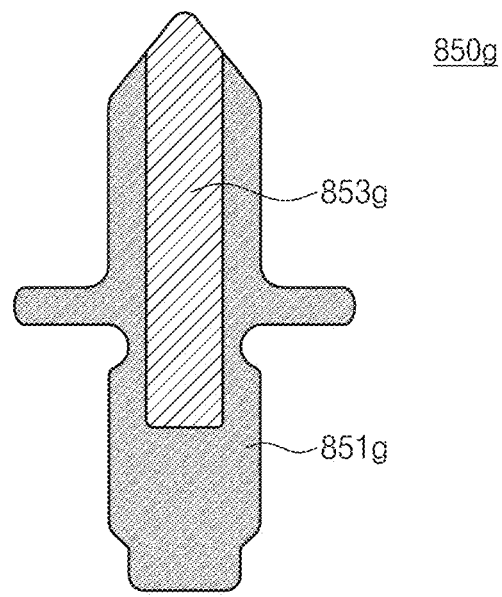

A second supporting pin 850g of FIG. 30 is provided similarly to the second supporting pin 850b of FIG. 25. However, the second supporting pin 850g is provided such that a cross sectional area ratio of a second body 853g to a first body 851g is greater than a cross sectional area ratio of the second body 853b to the first body 851b of FIG. 25. A cross sectional area of the second body 853g of FIG. 29 is greater than a cross sectional area of the second body 853b of FIG. 25.

Figure 31:
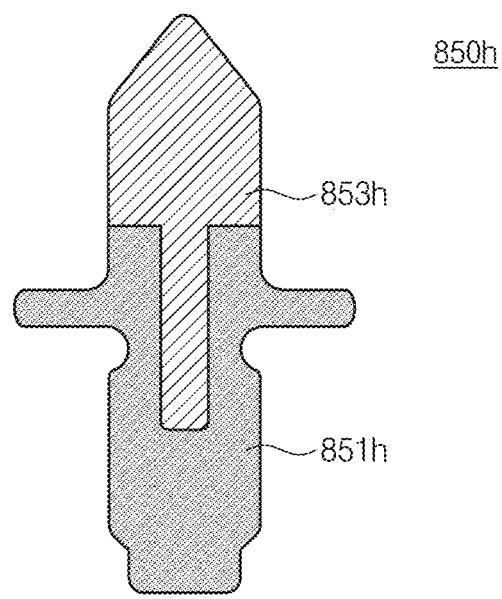

A second supporting pin 850h of FIG. 31 comprises a first body 851h provided with the first material and a second body 853h provided with the second material. A top of the second body 853h is placed above a top of the first body 851h. The first body 851h is provided to surround a lateral part of the second body 853h.

Referring back to FIG. 14, the second elevator unit 860 moves the second container 820 linearly to up and down direction. As the second container 820 moves up and down, a height of the second container 820 relative to the second spin head 830 is changed. The second elevator unit 860 comprises a second bracket 862, a second moving shaft 864, and a second driver 866.

The second bracket 862 is fixedly installed on outer wall of the second container 820. To the second bracket 862, the second moving shaft 864 moving up and down direction by the second driver 866 is fixedly coupled. When the substrate W is placed on the second spin head 830 or when lifted from the second spin head 830, the second container 820 descends such that the second spin head 830 protrudes upward from the second container 820. Also, during processing, the height of the second container 820 is controlled such that the treatment liquid flows into the predetermined collecting containers 822, 824, 826 depending on a kind of treatment liquid supplied in the substrate W.

In an example, when treating the substrate W with the first treatment liquid, the substrate W is placed on a height corresponding to the inner space 822a of the second inner collecting container 822. Also, when treating the substrate W with the second treatment liquid and the third treatment liquid, the substrate W is placed on a height corresponding to the interspace 824a between the second inner collecting container 822 and the second middle collecting container 824, and the interspace 826a between the second middle collecting container 824 and the second outer collecting container 826, respectively. Different from the above, the second elevator unit 860 may move the second spin head 830 up and down direction instead of the second container 820.

The second ejection unit 880 supplies the treatment liquid to the substrate W when treating the substrate W.

The second ejection unit 880 supplies a liquid to the substrate W placed in the second spin head 830. The second ejection unit 880 comprises a second nozzle support 882, a second nozzle 884, a second supporting shaft 886, and a second driver 888.

The second supporting shaft 886 is provided such that its lengthwise direction is parallel with the third direction 16, and the second driver 888 is coupled at the bottom of the second supporting shaft 886. The second driver 888 rotates and elevates the second supporting shaft 886 up and down. The second nozzle support 882 is perpendicularly coupled to one end of the second supporting shaft 886 which is opposite to the other end of the second supporting shaft 886 to which the second driver 888 is coupled. The second nozzle 884 is installed at the bottom of an end of the second nozzle support 862. The second nozzle 884 is moved to a processing position and a standby position by the second driver 884. The processing position is where the second nozzle 884 is located vertically above the second container 820, and the standby position is where the second nozzle 884 is not vertically above the deviated from the vertical top of the second container 820, e.g. out of the processing position.

The second ejection unit 880 may be provided with one or a plurality of numbers. When the second ejection unit 880 is provided with plurality numbers, a chemical, a rinse liquid, or an organic solvent may be provided through different second ejection units 880. The rinse liquid may be deionized water, and the organic solvent may be a mixed solution of an inert gas and an isopropyl alcohol gas or an isopropyl alcohol liquid.

A treatment liquid supplied in the second ejection unit 880 may supply a low temperature treatment liquid between 50-100° C. In an example, the treatment liquid may be a treatment liquid containing a sulfuric acid.

Figure 32:
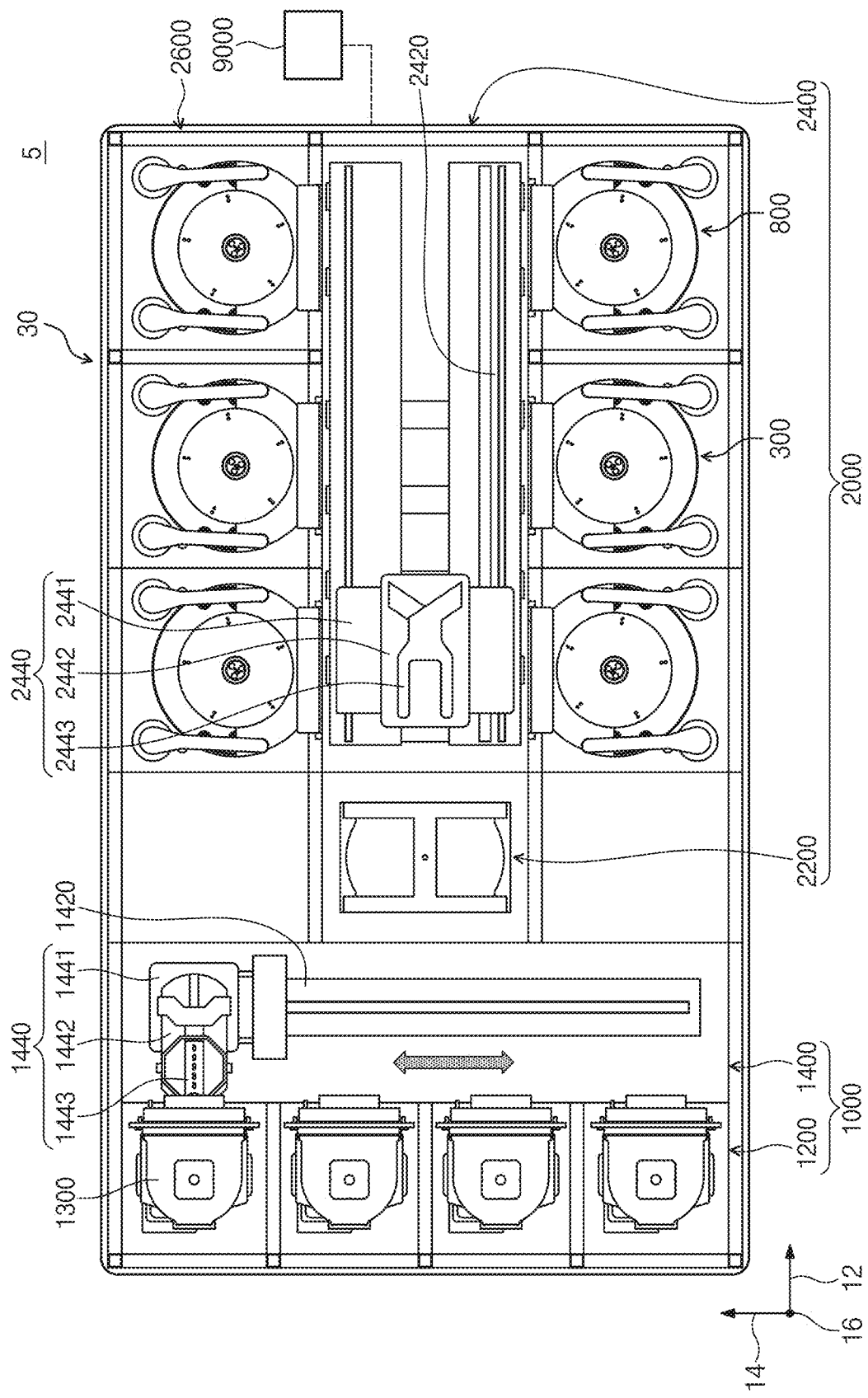
FIG. 32 is a plan vies of an apparatus for treating a substrate in accordance with an embodiment of the present invention.
Figure 33:
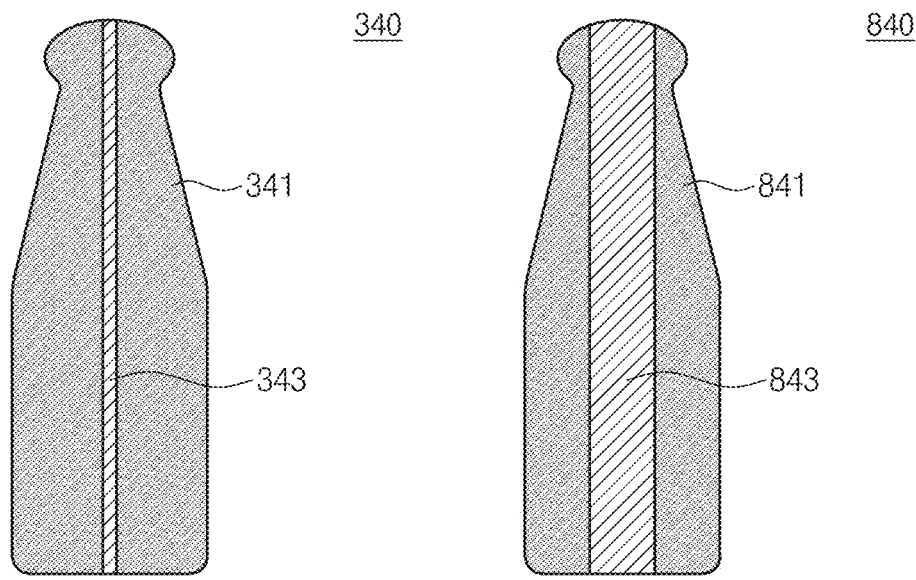
FIGS. 33 to 37 show the first chuck pin and the second chuck pin in accordance with an embodiment of the present invention.
Figure 34:
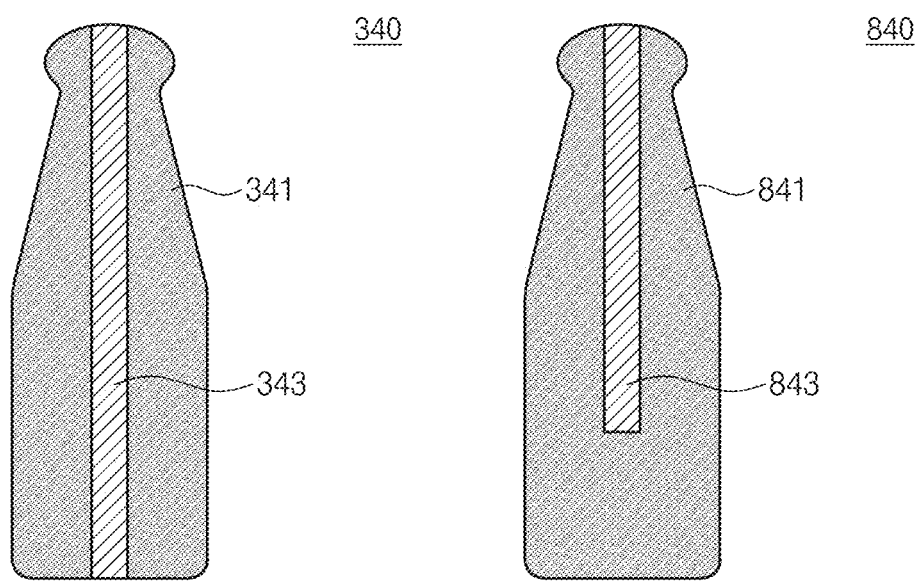
Figure 35:
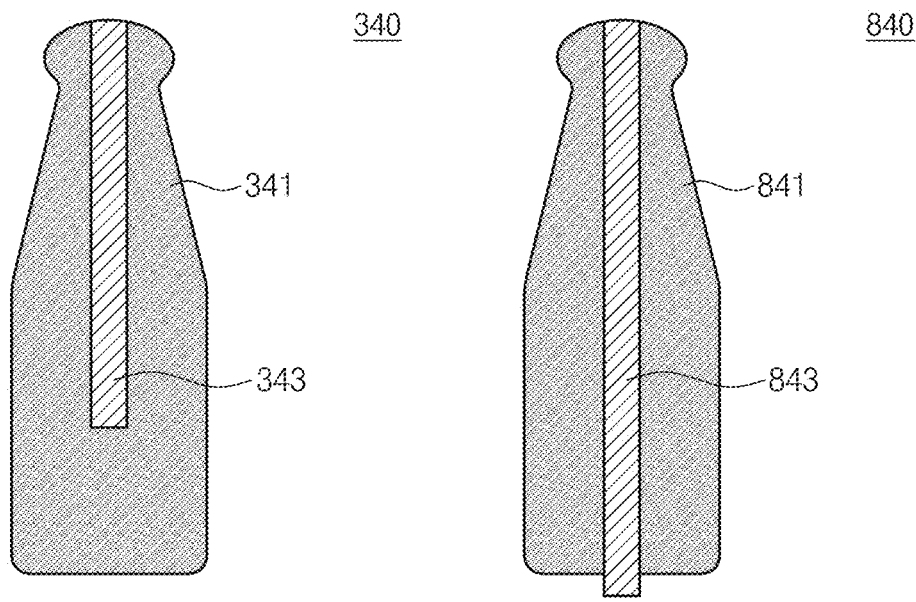
Figure 36:
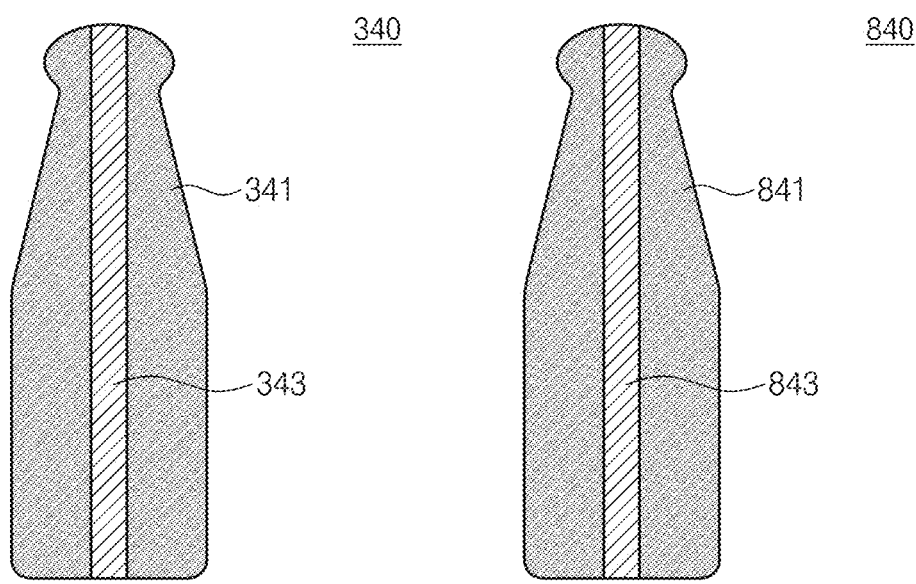
Figure 37:
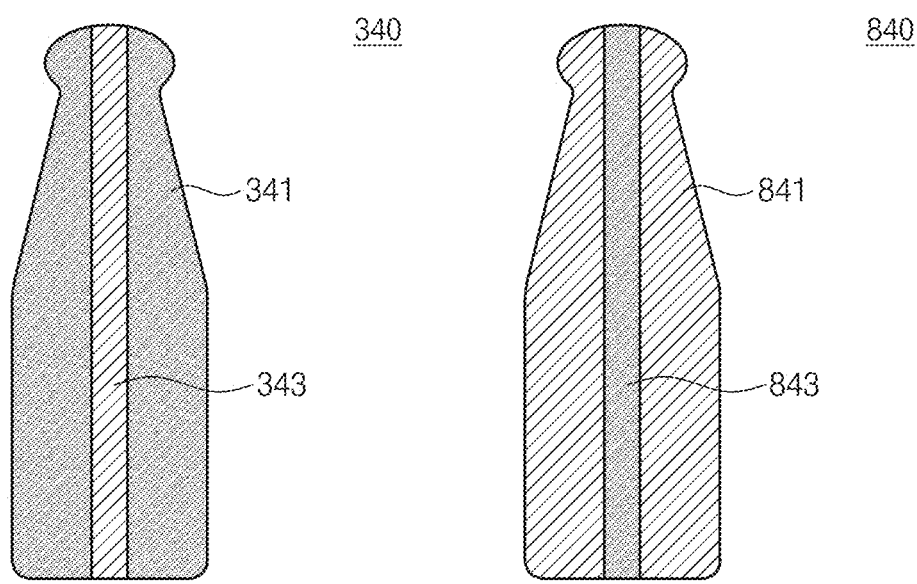

FIG. 32 is a plan vies of an apparatus for treating a substrate in accordance with an embodiment of the present invention. Hereinafter, referring to FIG. 32, an apparatus 5 for treating a substrate of FIG. 32 comprises a third apparatus 30 for treating a substrate. The third apparatus 30 for treating a substrate 30 comprises a third index module 1000 and a third process treating module 2000. Substantially, the third index module 1000 is provided the same with the first index module 100 of the first apparatus for treating a substrate 10.

The third process treating module 2000 comprises a third buffer unit 2200, a third transfer unit 2400, and a third process chamber 2600. Substantially, the third buffer unit 2200 and the third transfer unit 2400 of the third process treating module 2000 is provided the same with the first buffer unit 220 and the first transfer unit 240 of the first process treating module 200. The third process chamber 2600 comprises the first chamber 300 and the second chamber 800.

The third process chamber 2600 may treat the substrate on the first chamber 300 or the second chamber 800 depending on kinds of chemical and temperature.

A controller 9000 may control the third transfer unit so that the substrate may be treated in the first chamber 300 or in the second chamber 800 depending on kinds of chemical and temperature.

FIGS. 33 to 37 show correlations of the first chuck pin 340 and the second chuck pin 840 in accordance with an embodiment of the present invention. According to an embodiment of the present invention, a correlation of the first chuck pin and a correlation of the second chuck pin are provided differently from each other.

A correlation may be a cross sectional area ratio of the outer bodies 341, 841 and the inner bodies 343,843. A cross sectional area ratio of the first outer body 341 to the first inner body 343 and a cross sectional area ratio of the second outer body 841 to the second inner body 843 may not be the same, e.g. may be different. In an example, like FIG. 33, the cross sectional area ratio of the first outer body 341 to the first inner body 343 may be provided greater than the cross sectional area ratio of the second outer body 841 to the second inner body 843. In this case, the substrate W supported by the first chuck pin 340 is treated with the first treatment liquid having a high temperature, and the substrate W supported by the second chuck pin 840 is treated with the second treatment liquid having a low temperature. Unlike this, the cross sectional area ratio of the first outer body 341 to the first inner body 343 may be provided smaller than the cross sectional area ratio of the second outer body 841 to the second inner body 843.

The correlation may be a length ratio of the outer bodies 341, 841 and the inner bodies 343,843. In an example, a length ratio of the first outer body 341 to the first inner body 343 and a length ratio of the second outer body 841 to the second inner body 843 may not be the same, e.g. may be different. In an example, like FIG. 34, the length ratio of the first outer body 341 to the first inner body 343 may be smaller than the length ratio of the second outer body 841 to the second inner body 843. Unlike this, the length ratio of the first outer body 341 to the first inner body 343 may be greater than the length ratio of the second outer body 841 to the second inner body 843.

The correlation may be whether the inner bodies 343, 843, protrude to outside of the outer bodies 341, 841. In an example, like FIG. 35, the first inner body 343 may not protrude outside of the first outer body 341, e.g., the first inner body 343 may be placed inside of the first outer body 341, and the second inner body 843 may protrude outside of the second outer body 841. Unlike this, the first inner body 343 may protrude outside of the first outer body 341, and the second inner body 843 may be placed inside of the second outer body 841. Accordingly to some embodiments, the first inner body 343 may be placed inside of the first outer body 341, and the second inner body 843 may be placed inside of the second outer body 841. According to some embodiments, the second outer body 841 may protrude outside of first outer body 341, and the second inner body 843 may protrude outside of the second outer body 841.

The correlation may be a relationship of materials between the outer bodies 341, 841 and the inner bodies 343,843. In an example, the correlation may comprise providing a different materials between the first outer body 341 and the first inner body 343, and providing the same materials between the second outer body 841 and the second inner body 843. In an example, like FIG. 36, the first outer body 341 and the first inner body 343 may be provided with different materials, and the second outer body 841 and the second inner body 843 may be provided with different materials. In this case, the first outer body 341 and the second outer body 841 or the second inner body 843 may be provided with the same or different materials. The first inner body 343 and the second inner body 843 or the second outer body 841 may be provided with the same or different materials.

The correlation may include a relationship of materials between the first outer body 341 and the second inner body 843, and between the between the second outer body 841 and the first inner body 343. In an example, the first outer body 341 and the second inner body 843 may be provided with the first material or with the second material, and the second outer body 841 and the first inner body 343 may be provided with the second material or with the first material. Like FIG. 37, the first outer body 341 and the second inner body 843 may be provided with the first material, and the first inner body 343 and the second outer body 841 may be provided with the second material. In this case, the substrate W supported by the first chuck pin 340 is treated with the first treatment liquid having a high temperature, and the substrate W supported by the second chuck pin 840 is treated with the second treatment liquid having a low temperature. Any one material of the first material and the second material may be provided with a material having lower heat conductivity and better thermal resistance than the other of the first material and the second material. However, the second material may be provided with lower heat conductivity and a better thermal resistance than the first material.

Different from the above, the first outer body 341 and the second inner body 843 may be provided with the second material, and the first inner body 343 and the second outer body 841 may be provided with the first material.

In some embodiments, the first chuck pin 340 and the second chuck pin 840 may be provided differently in terms of at least two selected from material, length, ratio of the cross sectional area, and whether the inner body protrudes outside of the outer body.

As described above, the present invention may enhance efficiency of a process for treating the substrate W by providing the chuck pin with double materials depending on a temperature of the treatment liquid, and providing one or a plurality of factors among material, length, ratio of the cross sectional area, and the state whether the inner body protrudes outside of the outer body, and thereby providing the chuck pin having an optimized heat conductivity and thermal resistance depending on a process Specifically, the present invention may provide a chuck pin having different heat conductivity depending on a process by providing different materials of the chuck pin.

Also, the present invention may enhance efficiency of a process treating the substrate W by providing the supporting pin with double materials depending on a temperature of the treatment liquid, and providing one or a plurality of factors among material, length, ratio of the cross sectional area, and the state whether the inner body is protrude to outside of the outer body, and thereby providing the supporting pin having an optimized heat conductivity and thermal resistance depending on a process.

Foregoing embodiments are examples of the present invention. Further, the above contents merely illustrate and describe preferred embodiments and embodiments may include various combinations, changes, and environments. That is, it will be appreciated by those skilled in the art that substitutions, modifications and changes may be made in these embodiments without departing from the principles and spirit, the scope of which is defined in the appended claims and their equivalents. Further, it is not intended that the scope of this application be limited to these specific embodiments or to their specific features or benefits. Rather, it is intended that the scope of this application be limited solely to the claims which now follow and to their equivalents.

What is claimed is:

1. An apparatus for treating a substrate comprising:
    a first chamber for treating the substrate by supplying a first treatment liquid; and
    a second chamber for treating the substrate by supplying a second treatment liquid;
    wherein the first chamber comprises a first spin head comprising a first chuck pin for supporting the substrate at a lateral portion of the substrate and a first ejection unit for supplying the first treatment liquid to the substrate placed on the first spin head,
    wherein the second chamber comprises a second spin head comprising a second chuck pin for supporting the substrate from a lateral portion of the substrate and a second ejection unit for supplying the second treatment liquid to the substrate placed on the second spin head,
    wherein the first chuck pin comprises a first outer body and a first inner body provided with a different material from each other,
    wherein the second chuck pin comprises a second outer body and a second inner body provided with a different material from each other,
    wherein a correlation between the first outer body and the first inner body is provided differently from a correlation between the second outer body and the second inner body,
    wherein the correlation comprises what material each outer body and each inner body are provided with, wherein both of the first outer body and the second inner body are provided with one of a first material and a second material, and both of the second outer body and the first inner body are provided with the other of the first material and the second material, and
    wherein one of the first material and the second material is provided with a material having lower heat conductivity and a better thermal resistance than the other of the first material and the second material.

2. The apparatus for treating a substrate of claim 1, wherein the correlation further includes a ratio of a cross sectional area between the outer body and the inner body.

3. The apparatus for treating a substrate of claim 1, wherein the correlation further includes a ratio of a length between the outer body and the inner body.

4. The apparatus for treating a substrate of claim 1, wherein the correlation further includes whether or not the inner body protrudes outside of the outer body.

5. The apparatus for treating a substrate of claim 1, wherein the first material comprises a ceramic material and the second material is provided with a resin material.

6. The apparatus for treating a substrate of claim 5, wherein the ceramic material comprises a silicon carbide and the resin material is provided with a perfluoralkoxy (PFA).

7. The apparatus for treating a substrate of claim 1, wherein the first outer body has a first groove at a lateral portion thereof and an end of the substrate is contacted with the first groove, wherein the first inner body is provided with a rod shape, the second outer body has a second groove at a lateral portion thereof and an end of the substrate is contacted with the second groove, wherein the second inner body is provided with a rod shape.

8. The apparatus for treating a substrate of claim 1, wherein the first outer body is provided to surround a lateral portion and top of the first inner body and the second outer body is provided to surround a lateral portion and top of the second inner body.

9. The apparatus for treating a substrate of claim 1, wherein the first outer body is provided to surround a lateral portion of the first inner body, wherein a top of the first inner body is higher in level than a top of the first outer body, wherein the second outer body is provided to surround a lateral portion of the second inner body, and wherein a top of the second inner body is higher in level than a top of the second outer body.

10. The apparatus for treating a substrate of claim 1, wherein the first spin head further comprises a first supporting pin for supporting the substrate at a bottom of the substrate, wherein the second spin head further comprises a second supporting pin for supporting the substrate at the bottom of the substrate, wherein the second supporting pin comprises a first body and a second body provided with a different material from each other, wherein each of the first body and the second body is provided with any one of a first material or a second material, and wherein one of the first material and the second material is provided with a material having a lower heat conductivity and a better thermal resistance than the other of the first material and the second material.

11. The apparatus for treating a substrate of claim 10, wherein the first material comprises a ceramic material and the second material is provided with a resin material.

12. The apparatus for treating a substrate of claim 11, wherein the ceramic material comprises a silicon carbide and the resin material is provided with a perfluoralkoxy (PFA).

13. The apparatus for treating a substrate of claim 10, wherein a top of the first body is contacted with a bottom of the substrate and the second body is coupled to a bottom of the first body.

14. The apparatus for treating a substrate of claim 10, wherein the first body is provided to surround a lateral portion and top of the second body and wherein the second body is provided with a rod shape.

15. The apparatus for treating a substrate of claim 10, wherein the first body is provided with the first material and the second body is provided with the second material.

16. The apparatus for treating a substrate of claim 10, wherein the first body is provided with the second material and the second body is provided with the first material.

17. The apparatus for treating a substrate of claim 1, further comprising a first apparatus for treating a substrate and a second apparatus for treating a substrate,
wherein the first apparatus for treating a substrate comprises a first index module and a first process treating module, the first index module comprising a first load port on which a container containing the substrate is placed and a first index robot for transferring the substrate to the first load port, and the first process treating module comprising a plurality of a first process chambers for treating the substrate and a first transfer unit for transferring the substrate to the first process chambers,
wherein the second apparatus for treating a substrate comprises a second index module and a second process treating module, the second index module comprising a second load port on which a container containing the substrate is placed and a second index robot for transferring the substrate to the second load port, and the second process treating module comprising a plurality of a second process chambers for treating the substrate and a second transfer unit for transferring the substrate to the second process chambers,
wherein the first process chamber comprises the first chamber, and
wherein the second process chamber comprises the second chamber.

18. The apparatus for treating a substrate of claim 1, further comprising a first apparatus for treating a substrate and a second apparatus for treating a substrate,
wherein the first apparatus for treating a substrate comprises a first index module and a first process treating module, the first index module comprising a first load port on which a container containing the substrate is placed and a first index robot for transferring the substrate to the first load port, and the first process treating module comprising a plurality of a first process chambers for treating the substrate and a first transfer unit for transferring the substrate to the first process chambers,
wherein the second apparatus for treating a substrate comprises a second index module and a second process treating module, the second index module comprising a second load port on which a container containing the substrate is placed and a second index robot for transferring the substrate to the second load port, and the second process treating module comprising a plurality of a second process chambers for treating the substrate and a second transfer unit for transferring the substrate to the second process chambers,
wherein the first process chamber comprises the first chamber and the second chamber.

19. The apparatus for treating a substrate of claim 17, wherein a temperature of the first treatment liquid is higher than a temperature of the second treatment liquid.

20. The apparatus for treating a substrate of claim 17, wherein the first apparatus for treating a substrate comprises a heating unit heating the substrate and positioned in the first spin head.

21. The apparatus for treating a substrate of claim 17, further comprising a controller for controlling the first transfer unit and the second transfer unit, wherein the controller controls the first transfer unit so that the substrate is supported by the first chuck pin when treating the substrate with the first treatment liquid and the controller controls the second transfer unit so that the substrate is supported by the second chuck pin when treating the substrate with the second treatment liquid.

* * * * *